United States Patent
Lee et al.

(10) Patent No.: US 10,714,563 B2
(45) Date of Patent: Jul. 14, 2020

(54) DISPLAY DEVICE HAVING AN ARRANGEMENT OF SIGNAL LINES AT A WIRING PORTION

(71) Applicant: Samsung Display Co., Ltd., Yongin-si, Gyeonggi-do (KR)

(72) Inventors: Dong-Hyun Lee, Suwon-si (KR); Hyeon-Do Park, Gwangmyeong-si (KR); Ha Gyeong Song, Cheonan-si (KR); Hyun Young Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/175,769

(22) Filed: Oct. 30, 2018

(65) Prior Publication Data

US 2019/0198598 A1    Jun. 27, 2019

(30) Foreign Application Priority Data

Dec. 22, 2017    (KR) .......................... 10-2017-0178603

(51) Int. Cl.
*G09G 3/20* (2006.01)
*H01L 27/32* (2006.01)
(Continued)

(52) U.S. Cl.
CPC .......... *H01L 27/3276* (2013.01); *G09G 3/20* (2013.01); *G09G 3/3233* (2013.01); *G09G 3/3258* (2013.01); *G09G 3/3614* (2013.01); *H01B 7/2806* (2013.01); *H01L 27/124* (2013.01); *H01L 27/1244* (2013.01);
(Continued)

(58) Field of Classification Search
CPC ............... H01L 27/3276; H01L 27/124; H01L 27/3246; H01L 27/326; H01L 29/786; G09G 3/3233; G09G 3/3258; G09G 3/3614; G09G 3/20; G09G 2320/043; G02F 1/1345
See application file for complete search history.

(56) References Cited

U.S. PATENT DOCUMENTS

2014/0070709 A1* 3/2014 Lee .................... H05B 33/0896
315/176

FOREIGN PATENT DOCUMENTS

| EP | 3 226 234 A1 | 10/2017 |
| KR | 10-0457605 B1 | 11/2004 |
| KR | 10-1429908 B1 | 8/2014 |

OTHER PUBLICATIONS

EPO Extended Search Report dated Apr. 26, 2019, for corresponding European Patent Application No. 18210820.9 (13 pages).

* cited by examiner

*Primary Examiner* — Lisa S Landis
(74) *Attorney, Agent, or Firm* — Lewis Roca Rothgerber Christie LLP

(57) ABSTRACT

The present disclosure relates to a display device. The display device according to an exemplary embodiment includes a display area comprising a plurality of pixels, a peripheral area that is disposed outside the display area, and a wiring portion in the peripheral area. The wiring portion includes a plurality of signal lines that are adjacent to each other and are arranged along a first direction and each extends in a second direction that is different from the first direction. The plurality of signal lines are arranged in an order of average voltages of signals respectively transmitted by the plurality of signal lines during one frame.

25 Claims, 13 Drawing Sheets

(51) Int. Cl.
  *H01L 27/12*      (2006.01)
  *G09G 3/36*       (2006.01)
  *H01L 29/786*     (2006.01)
  *G09G 3/3233*     (2016.01)
  *G09G 3/3258*     (2016.01)
  *H01B 7/28*       (2006.01)
  *G02F 1/1345*     (2006.01)
  *G02F 1/1333*     (2006.01)

(52) U.S. Cl.
  CPC ........ *H01L 27/326* (2013.01); *H01L 27/3246* (2013.01); *H01L 29/786* (2013.01); *G02F 1/1345* (2013.01); *G02F 2001/13456* (2013.01); *G02F 2001/133388* (2013.01); *G09G 2300/0426* (2013.01); *G09G 2320/043* (2013.01); *G09G 2330/04* (2013.01)

FIG. 2

| Signal line | SL1 | SL2 | | SL3 | SL4 | SL5 | SL6 | SL7 | SL8 | SL9 | SL10 | SL11 | SL12 |
|---|---|---|---|---|---|---|---|---|---|---|---|---|---|
| Type | VGL | ACL_FLM | | ELVSS | VINT | EM_CLK1 | EM_CLK2 | CLK1 | CLK2 | FLM | MCD1 | MCD2 | VGH |
| Exemplary voltage | −9V | −9V | | −5V | −4.5V | −9V | −9V | −9V | −9V | −9V | 6.7V | 6.7V | 6.7V |
|  |  | 6.7V | | | | 6.7V | 6.7V | 6.7V | 6.7V | 6.7V | | | |
| Duty ratio | 1 | a | | 1 | 1 | 1 | 1 | 2 | 2 | c | 1 | 1 | 1 |
|  |  | b | | | | 2 | 2 | 11 | 11 | d | | | |

DISPLAY DEVICE HAVING AN ARRANGEMENT OF SIGNAL LINES AT A WIRING PORTION

CROSS-REFERENCE TO RELATED APPLICATION

This application claims priority to and the benefit of Korean Patent Application No. 10-2017-0178603 filed in the Korean Intellectual Property Office on Dec. 22, 2017, the entire contents of which are incorporated herein by reference.

BACKGROUND

1. Field

The present disclosure relates to a display device.

2. Description of the Related Art

A display device such as a liquid crystal display (LCD) and an organic light emitting diode (OLED) display may include a display panel that includes a display area where a plurality of pixels that can display an image are disposed. Each pixel may include a pixel electrode that receives a data voltage, and the pixel electrode may be connected with at least one transistor and may receive the data voltage.

Various signals and voltages that are used for driving of the display panel may be received from a driving circuit chip and/or a circuit film connected to the display panel. The driving circuit chip and the circuit film may be installed in a peripheral area that is disposed outside the display area of the display panel and may be connected with the display panel.

The above information disclosed in this Background section is only for enhancement of understanding of the background of the invention and therefore it may contain information that does not form prior art.

SUMMARY

Aspects of embodiments of the present disclosure provide a display device that can delay occurrence of corrosion in signal lines disposed in a peripheral area and reduce the degree of corrosion.

According to an aspect of the present disclosure, a display device includes: a display area comprising a plurality of pixels, and a peripheral area that is outside the display area; and a wiring portion in the peripheral area and including a plurality of signal lines that are adjacent to each other, wherein, in the wiring portion, the plurality of signal lines are arranged along a first direction, each of the plurality of signal lines extends in a second direction that is different from the first direction, and the plurality of signal lines are arranged in an order of average voltages of signals respectively transmitted by the plurality of signal lines during one frame.

In some embodiments, an order of the signal lines having the same average voltage as each other from among the plurality of signal lines may be variable.

In some embodiments, a gap between adjacent signal lines from among the plurality of signal lines may be dependent on a difference between average voltages of the signals transmitted by the adjacent signal lines.

In some embodiments, the plurality of signal lines may include: a first signal line that transmits a signal of which an average voltage is a first voltage; a second signal line that transmits a signal having a second voltage during a continuous time of 9/10 of one frame or more, and a third voltage that is different from the second voltage during a remaining continuous time of the frame; and a third signal line that transmits a signal of which an average voltage is a fourth voltage that is different from the first voltage, wherein the second voltage may equal the first voltage or may be between the first voltage and the fourth voltage, and the second signal line may be disposed between the first signal line and the third signal line.

In some embodiments, a difference between the second voltage and the first voltage may be smaller than a difference between the second voltage and the fourth voltage, and a gap between the second signal line and the first signal line may be smaller than a gap between the second signal line and the third signal line.

In some embodiments, the plurality of signal lines may be divided into a first group, a second group, and a third group that are adjacent to each other, a polarity of signals transmitted by the signal lines included in the first group may be a first polarity during a continuous time of 9/10 of the frame or more, a polarity of signals transmitted by the signal lines included in the third group may be a second polarity during a continuous time of 9/10 of the frame or more, the signal lines included in the second group transmit clock signals of which voltage levels may be changed with a period that is shorter than 1/10 of the frame, and the second group may be disposed between the first group and the third group.

In some embodiments, at least one of the first group and the third group may include a signal line transmitting a signal of which a voltage varies by the frame.

In some embodiments, a gap between two adjacent groups from among the first group, the second group, and the third group is at least as wide as a widest gap from among gaps between adjacent signal lines from among the plurality of signal lines.

In some embodiments, when a difference between the average voltages of two adjacent signal lines from among the plurality of signal lines is a first constant voltage or less, a gap between the two adjacent signal lines may be a first gap, when a difference between the average voltages of two adjacent signal lines from among the plurality of signal lines is a second constant voltage or more, a gap between the two adjacent signal lines is a second gap that may be greater than the first gap, and when a difference between the average voltages of two adjacent signal lines from among the plurality of signal lines is between the first constant voltage and the second constant voltage, a gap between the two adjacent signal lines is a third gap that may be greater than the first gap and smaller than the second gap.

In some embodiments, a substrate may be further comprised, and the substrate may include a bending area that is bendable or in a bent state, and the wiring portion may include a portion that is in the bending area.

In some embodiments, the display device may include a first conductive layer, a second conductive layer, and a third conductive layer that are on the substrate and located in different layers from each other, wherein at least one of the plurality of signal lines may include a first wire in the first conductive layer, a second wire in the second conductive layer, and a third wire in the third conductive layer, and the first wire may be outside the bending area, and, in a peripheral area of the bending area, the second wire may be electrically connected with the first wire through a first contact portion and the third wire may be electrically connected with the second wire through a second contact portion.

In some embodiments, in a plan view, the third wire may overlap the first contact portion and the second contact portion.

In some embodiments, in the bending area, the second wire and the third wire may extend in parallel with each other while overlapping each other.

According to another aspect of the present disclosure, a display device includes: a display area comprising a plurality of pixels; a peripheral area that is disposed outside the display area and includes a bending area; and a wiring portion that includes a first group, a second group, and a third group that are adjacent to each other, wherein each of the first group, the second group, and the third group comprises signal lines that include portions passing the bending area, the second group is between the first group and the third group, the signal lines included in the second group transmit clock signals of which voltage levels are changed with a period that is shorter than 1/10 of one frame, the signal lines included in the first group transmit signals of a first polarity during a continuous time of 9/10 of the frame or more, and the signal lines included in the third group transmit signals of a second polarity during a continuous time of 9/10 of the frame or more.

In some embodiments, at least one of the first group and the third group may include a signal line that transmits a signal of which a voltage is changed by the frame.

In some embodiments, when a difference between average voltages of two adjacent signal lines from among the signal lines is a first constant voltage or less, a gap between the two adjacent signal lines may be a first gap, when the difference between average voltages of the two adjacent signal lines from among the signal lines is greater than a second constant voltage or more, the gap between the two adjacent signal lines may be a second gap that is greater than the first gap, and when the difference between average voltages of the two adjacent signal lines from among the signal lines is between the first constant voltage and the second constant voltage, the gap between the two adjacent signal lines may be a third gap that is greater than the first gap and smaller than the second gap.

In some embodiments, in at least one of the first group, the second group, and the third group, the signal lines may be arranged in an order of average voltages of signals that are respectively transmitted by the signal lines during one frame.

In some embodiments, a gap between adjacent signal lines from among the signal lines may be dependent on a difference between average voltages of signals transmitted by the adjacent signal lines.

In some embodiments, at least one of the signal lines may include wires that are respectively disposed in a first conductive layer, a second conductive layer, and a third conductive layer that are respectively different conductive layers from each other, the first conductive layer may be disposed outside the bending area, the second conductive layer and the third conductive layer may include portions that pass the bending area, and, in a peripheral area of the bending area, the second conductive layer may be electrically connected with the first conductive layer through a first contact portion, and the third conductive layer may be electrically connected with the second conductive layer through a second contact portion.

In some embodiments, in a plan view, the third conductive layer included in the signal line may overlap the first contact portion and the second contact portion.

According to another aspect of the present disclosure, a display device includes: a display area that includes a plurality of pixels, and a peripheral area that is outside the display area; and a wiring portion that is disposed in the peripheral area, wherein the wiring portion may include a gate low voltage wire, a first frame signal wire, a common voltage wire, a plurality of clock signal lines, a second frame signal wire, and a gate high voltage wire, which are sequentially arranged.

In some embodiments, the display device may further include an initialization voltage wire that is between the common voltage wire and the plurality of clock signal wires.

In some embodiments, the display device may further include a test circuit voltage wire that is between the second frame signal wire and the gate high voltage wire.

According to the present exemplary embodiments, occurrence of corrosion in signal lines in the peripheral area may be delayed and the degree of corrosion may be reduced.

BRIEF DESCRIPTION OF THE DRAWINGS

FIG. 2 is a graph that shows features of signals transmitted by signal lines of the wiring portion of the display device according to the exemplary embodiment;

DETAILED DESCRIPTION

Figure 1:
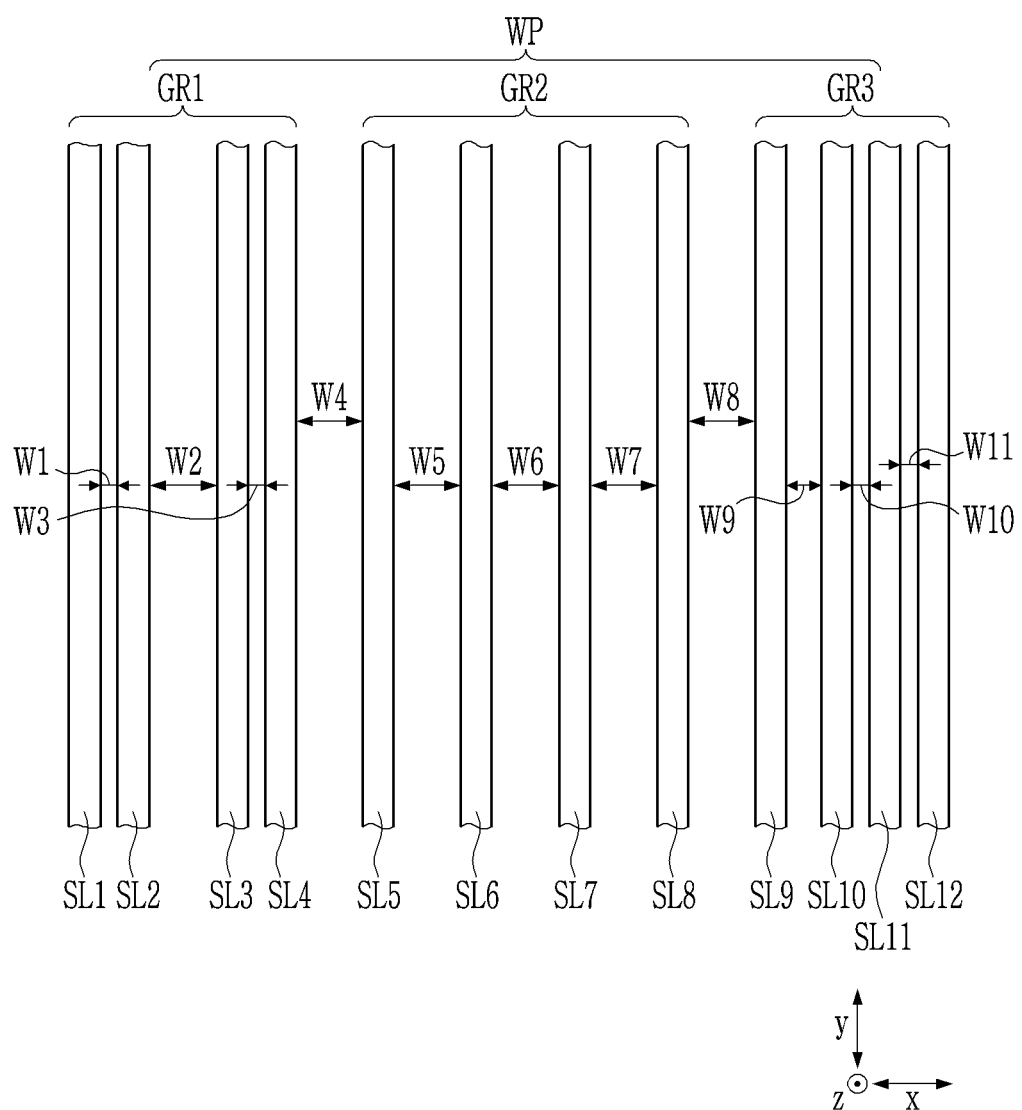
FIG. 1 is a plan layout view of a wiring portion that is disposed in a peripheral area of a display device according to an exemplary embodiment.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

In the entire specification, "in a plan view" implies a view in which a plane parallel to two directions (e.g., the x-axis direction and the y-axis direction) that cross each other is observed, and "in a cross-sectional view" implies a view in which a plane cut in a direction that is perpendicular to the plane that is parallel to the x-axis direction and the y-axis direction is observed. In addition, when constituent elements overlap, it implies that the two constituent elements overlap in the z-axis direction (e.g., a direction that is perpendicular to a top surface of a substrate), unless otherwise noted.

Referring to FIG. 1 to FIG. 4, a display device according to an exemplary embodiment will be described.

Referring to FIG. 1, a display device according to an exemplary embodiment includes a wiring portion WP that includes a plurality of signal lines SL1 to SL12. The signal lines SL1 to SL12 are arranged at a distance from each other in the x-axis direction. The respective signal lines SL1 to SL12 may substantially extend in a direction that is different from the x-axis direction, for example, in the y-axis direction that is perpendicular to the x-axis direction. However, this is not restrictive, and the respective signal lines SL1 to SL12 may extend in a direction that is oblique to the y-axis direction. FIG. 1 shows that the wiring portion WP include twelve signal lines SL1 to SL12, but the number of signal lines included in a wiring portion WP according to an exemplary embodiment is not limited thereto.

The wiring portion WP may be divided into a first group GR1, a second group GR2, and a third group GR3 that are adjacent to each other, and each of the groups GR1, GR2, and GR3 may include two or more signal lines from among the plurality of signal lines SL1 to SL12. The second group may be disposed between the first group GR1 and the third group GR3.

The signal lines SL1 to SL12 may respectively transmit signals. The signal lines SL1 to SL12 are sequentially arranged in the order of average voltages during a predetermined period (e.g., one frame) of a signal transmitted by each of the signal lines SL1 to SL12. For example, a signal line SL1 may transmit a signal of the lowest average voltage and a signal line SL12 may transmit a signal of the highest average voltage in FIG. 1, and signals lines SL2 to SL11 between the signal line SL1 and the signal line SL12 may be sequentially arranged in the order of increasing average voltage from left to right. On the contrary, the signal line SL1 may transmit a signal of the highest average voltage and the signal line SL12 may transmit a signal of the lowest average voltage, and the signals lines SL2 to SL11 between the signal line SL1 and the signal line SL12 may be sequentially arranged in the order of decreasing average voltage from left to right. When signal lines SL1 to SL12 transmit signals having the same average voltages as each other, the order between the signal lines SL1 to SL12 may be variable and may be freely changed.

Figure 3:
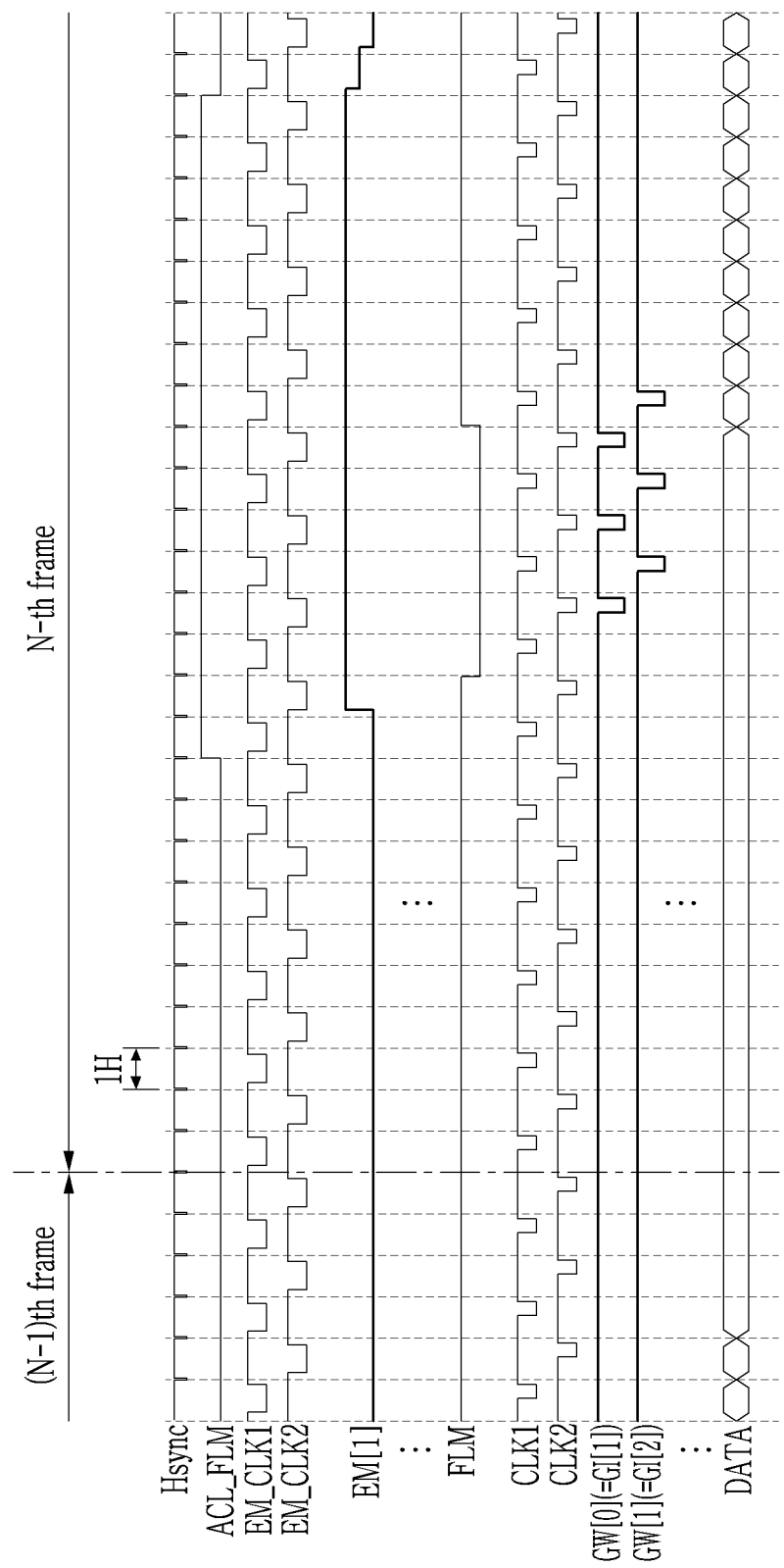
FIG. 3 is a waveform diagram of signals transmitted by the signal lines of the wiring portion of the display device according to the exemplary embodiment.

FIG. 2 exemplarily shows types, voltages, and duty ratios of signals included in the wiring portion WP when the wiring portion WP, according to the exemplary embodiment, is included in the display device. FIG. 3 shows waveforms of signals that some of the signal lines SL1 to SL12 on the wiring portion WP that may be included in the display device according to the exemplary embodiment. Frames such as an (N−1)-th frame and an N-th frame may be, for example, periods during which an image displayed by a display area of the display device is refreshed.

Referring to FIG. 2, in a first group GR1, a signal transmitted by the signal line SL1 may be a first voltage, which is a constant voltage. The first voltage may be, for example, a negative voltage, and a duty ratio thereof is 1 such that the first voltage can maintain a constant voltage level during one frame. The first voltage may be, for example, −9 V, and in this case, an average voltage of the signal SL1 may be −9 V during one frame.

The signal line SL1 may be, for example, a gate low voltage wire that transmits a gate low voltage VGL. The gate low voltage VGL may be transmitted to a circuit portion (e.g., gate drivers 400a and 400b shown in FIG. 4) that generates a gate signal. The gate low voltage VGL may be used in generation of a low voltage level of the gate signal in the circuit portion.

A signal transmitted by the signal line SL2 may be a second voltage during a continuous time of at least about 9/10 or more of a frame, and may be a third voltage that is different from the second voltage during the remaining continuous time of the frame. The second voltage may be equal to the first voltage, or may be an average voltage between the first voltage and a signal transmitted by the signal line SL3 at the right side thereof. A polarity of the third voltage may be opposite to that of the second voltage. The second voltage may be, for example, a negative (−) voltage, and the third voltage may be, for example, a positive (+) voltage. A duty ratio of the second voltage and the third voltage may be a:b (where a is about 9 or higher and b may be about below 1). The second voltage is a low voltage level, and may be, for example, −9 V, while the third voltage is a high voltage, and may be, for example, 6.7 V. In this case, an average voltage of the signal line SL2 during one frame may be about below −7.43 V.

The signal transmitted by the signal line SL2 is a signal of which a voltage varies with the period of one frame, and may have approximately one pulse during one frame. A signal transmitted by the signal line SL1 may transmit a signal having a voltage that is equal to or close to an average voltage of the signal transmitted by the signal line SL1. That is, an average voltage of the signal transmitted by the signal line SL2 during one frame may be similar to, or, depending on a pulse width, slightly higher than, an average voltage of the signal transmitted by the signal line SL during one frame.

Referring to FIG. 2 and FIG. 3, in some embodiments, the signal line SL2 may be, for example, an emission frame signal wire that transmits a light emitting frame signal ACL_FLM. The light emitting frame signal ACL_FLM may be transmitted to the circuit portion that generates the gate signal. The light emitting frame signal ACL_FLM may instruct the start of one frame for inputting an emission control signal EM to the display area (e.g., a display area DA shown in FIG. 4) in the display device. For example, a high voltage level of the emission frame signal SCL_FLM may be about 6.7 V and a low voltage level thereof may be about −9 V.

Figure 4:
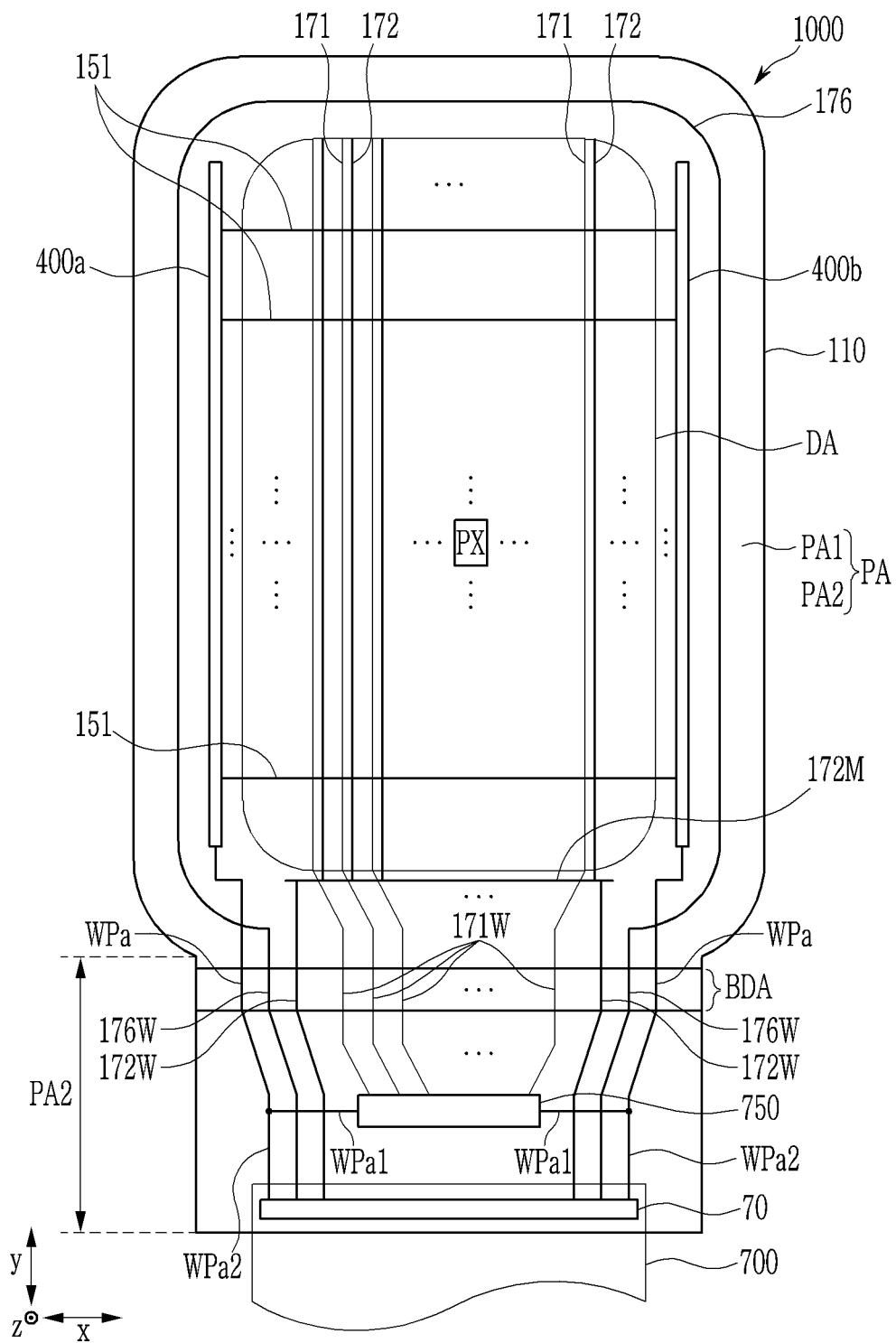
FIG. 4 is a plan layout view of a display device according to an exemplary embodiment.

In some embodiments, the signal line SL3 and the signal line SL4 may transmit signals input to the display device DA in a display device as shown in FIG. 4.

In some embodiments, a signal transmitted by the signal line SL3 may be a fourth voltage that is a constant voltage. The fourth voltage may be, for example, a negative (−) voltage, and a duty ratio thereof is 1, such that the fourth voltage may be maintained at a constant voltage level during one frame. The fourth voltage may be about −5 V, and in this case, an average voltage of the signal line SL3 during one frame may be −5 V. A difference between an average voltage of a signal transmitted by the signal line SL3 during one frame and an average voltage of a signal transmitted by the signal line SL2 during one frame may be greater than a difference between an average voltage of a signal transmitted by the signal line SL1 during one frame and the average voltage of the signal transmitted by the signal line SL2 during one frame.

In some embodiments, the signal line SL3 may be, for example, a common voltage wire (or a low voltage power wire) that transmits a common voltage ELVSS. The common voltage ELVSS may be a constant negative (−) voltage. The signal line SL3 may, for example, extend to a portion that extends along the periphery of the display area DA shown in FIG. 4, and such a portion may serve as a guard ring.

In some embodiments, a signal transmitted by the signal line SL4 may be a fifth voltage, which is a constant voltage. The fifth voltage may be, for example, a negative (−) voltage, and a duty ratio thereof is 1, such that the fifth voltage may be maintained at a constant voltage level during one frame. The fifth voltage may be, for example, −4.5 V, and in this case, an average voltage of the signal line SL4 during one frame may be −4.5 V.

In some embodiments, the signal line SL4 may be, for example, an initialization voltage wire that transmits an initialization voltage VINT. The initialization voltage VINT may be transmitted to an initialization voltage transmission line that is disposed in the display area and thus used in driving for display.

In some embodiments, in a second group GR2, a signal transmitted by a signal line SL5 and a signal transmitted by a signal line SL6 may be clock signals of which a voltage level varies with a first time, which is less than about 1/10 of one frame. The first time may be an integer multiple of one horizontal period (1 Hsync, 1H). The one horizontal period equals one period of a horizontal synchronization signal or a data enable signal, and may become a reference of an output time difference of an adjacent scan signal. In the display device, the total number of scan lines to which a scan signal is input during one frame may be about over 2400.

In some embodiments, two swing voltage levels of the signals transmitted by the signal line SL5 and the signal line SL6 are a sixth voltage and a seventh voltage, and for example, the sixth voltage may be a negative (−) voltage and the seventh voltage may be a positive (+) voltage. A duty ratio of the sixth voltage and the seventh voltage may be about 1:2, but this is not restrictive. The sixth voltage may be, for example, −9 V, and the seventh voltage may be, for example, 6.7 V, and in this case, average voltages of the signal lines SL5 and SL6 during one frame may respectively be about 1.47V.

Referring to FIG. 2 and FIG. 3, the signal line SL5 and the signal line SL6 may respectively be, for example, clock signal wires that transmit an emission clock signal EM_CLK1 and an emission clock signal EM_CLK2. The emission clock signals EM_CLK1 and EM_CLK2 are transmitted to the circuit portion that generates the gate signal and thus may be used in generation of an emission control signal for controlling the light emission of pixels PX included in the display area DA shown in FIG. 4. The emission clock signals EM_CLK1 and EM_CLK2 may each have a high voltage level of about 6.7 V and a low voltage level of about −9 V.

In some embodiments, a signal transmitted by a signal line SL7 and a signal transmitted by a signal line SL8 may be clock signals of which a voltage level varies with a second time, which is less than about 1/10 of one frame. The second time may be an integer multiple of one horizontal period. Two swing voltage levels of the signals transmitted by the signal line SL7 and the signal line SL8 are an eighth voltage and a ninth voltage, and for example, the eighth voltage may be a negative (−) voltage and the ninth voltage may be a positive (+) voltage. A duty ratio of the eighth voltage and the ninth voltage may be about 2:11, but this is not restrictive. The eighth voltage may be, for example, −9 V, and the ninth voltage may be, for example, 6.7 V, and in this case, average voltages of the signal lines SL7 and SL8 during one frame may respectively be about 4.28 V.

Referring to FIG. 2 and FIG. 3, the signal line SL7 and the signal line SL8 may be clock signal wires that transmit, for example, a clock signal CLK1 and a clock signal CLK2. The clock signals CLK1 and CLK2 may be transmitted to the circuit portion that generates the gate signal, and thus may be used in generation of scan signals GW and GI input to the display area DA shown in FIG. 4. The clock signals CLK1 and CLK2 may each have a high voltage level of about 6.7 V and a low voltage level of about −9 V.

In some embodiments, in a third group GR3, a signal transmitted by a signal line SL9 may be a tenth voltage during a continuous time of about over 9/10 of one frame, and may be an eleventh voltage, which is different from the tenth voltage, during a remaining continuous time. The tenth voltage may be equal to or smaller than a voltage transmitted by a signal line SL10, and may be greater than the eleventh voltage. A polarity of the tenth voltage may be opposite to that of the eleventh voltage. The eleventh voltage may be, for example, a negative (−) voltage and the tenth voltage may be, for example, a positive (+) voltage, and a duty ratio of the eleventh voltage and the tenth voltage may be c:d (where c is about below 1 and d is about 9 or higher). The eleventh voltage may be a low voltage level of, for example, −9 V, and the tenth voltage may be a high voltage level of, for example, 6.7 V. In this case, an average voltage of the signal line SL9 during one frame may be about higher than 5.13 V.

In some embodiments, a signal transmitted by the signal line SL9 is a signal of which a voltage varies with one frame, and may have approximately one pulse during one frame. The signal transmitted by the signal line SL9 may maintain a constant voltage during most of one frame, and the constant voltage may be equal to or close to an average voltage of a signal transmitted by the signal line SL10 that is adjacent to the signal line SL9 at the right. That is, the average voltage of the signal transmitted by the signal line SL9 during one frame may be similar to or slightly lower than the average voltage of the signal transmitted by the signal line SL10 depending on a pulse width during one frame.

Referring to FIG. 2 and FIG. 3, the signal line SL9 may be, for example, a frame signal wire that transmits a frame signal FLM. The frame signal FLM may be transmitted to the circuit portion that generates the gate signal. The frame signal FLM may instruct the start of one frame for inputting the scan signals GW and GI to the display area DA of FIG. 4 in the display device. When the scan signals GW and GI are input to pixels PX of the display area DA, a data signal DATA may be input to the pixel PX through a turned-on switch. A high voltage level of the frame signal FLM may be about 6.7 V, and a low level voltage of the frame signal FLM may be about −9 V.

In some embodiments, signals transmitted by the signal line SL10 and the signal line SL11 each may be a twelfth voltage, which is a constant voltage. The twelfth voltage may be, for example, a positive (+) voltage, and a duty ratio thereof is 1 such that the twelfth voltage may maintain a constant voltage level during one frame. The twelfth voltage may be, for example, 6.7 V, and in this case, the signal line SL10 and the signal line SL11 may each have an average voltage of 6.7 V during one frame. A difference between the average voltage of the signal transmitted by the signal line SL10 and the average voltage of the signal transmitted by the signal line SL9 during one frame may be smaller than a difference between the average voltage of the signal transmitted by the signal line SL8 and the average voltage of the signal transmitted by the signal line SL9 during one frame.

The signal line SL10 and the signal line SL11 may be, for example, test circuit voltage wires that transmit a test circuit voltage MCD1 and a test circuit voltage MCD2, respectively. The test circuit voltages MCD1 and MCD2 may be input to a test circuit that is disposed at a peripheral area of the display device for testing for a defect in the display device.

In some embodiments, a signal transmitted by the signal line SL12 may be a thirteenth voltage, which is a constant voltage. The thirteenth voltage may be, for example, a positive (+) voltage, and a duty ratio thereof is 1 such that the thirteenth voltage may maintain a constant voltage level during one frame. The thirteenth voltage may be, for example, 6.7 V, and in this case, an average voltage of the signal SL12 may be 6.7 V during one frame.

The signal line SL12 may be, for example, a gate high voltage wire that transmits a gate high voltage VGH. The gate high voltage VGH may be transmitted to a circuit portion (e.g., gate drivers 400a and 400b shown in FIG. 4) that generates a gate signal. The gate high voltage VGH may be used in generation of a high voltage level of the gate signal.

In some embodiments, the third group GR3 may further include a signal line that is disposed adjacent to the signal lines SL10 to SL12 or between the signal lines SL10 to SL12 and transmits a signal of which a voltage is similar to that of the signal lines SL10 to SL12, for example, a signal line transmitting RGB constant voltages DC_R, DC_G, and DC_B, a signal line transmitting a gate constant voltage DC_GATE, and the like. The signal line that transmits the RGB constant voltages DC_R, DC_G, and DC_B is connected to an input terminal of a driving portion 750 or a transistor included in a lighting circuit portion that is disposed between the driving portion 750 and the substrate 110 to transmit the RGB constant voltages DC_R, DC_G, and DC_B. The signal line that transmits the gate constant voltage DC_GATE is connected to a control terminal of the transistor of the lighting circuit portion, and transmits the gate constant voltage DC_GATE.

The signal lines SL1, SL2, SL5-SL9, and SL12 may be connected with the gate drivers 400a and 400b, the signal line SL3 may be connected with a portion that serves as the guard ring as described above, the signal line SL4 may be connected with the initialization voltage line of the display area DA, and the signal lines SL10 and SL11 may be connected with a crack detection circuit that is disposed in a first peripheral area PA1 or a second peripheral area PA2.

As in the present exemplary embodiment, when the signal lines SL1 to SL12 are arranged in the order of the average voltage during one frame of the signals transmitted by the signal lines SL1 to SL12, a voltage difference between signals transmitted by adjacent signal lines SL1 to SL12 can be reduced or minimized during one frame such that an electric field between the adjacent signal lines SL1 to SL12 in the wiring portion WP can be reduced or minimized, thereby reducing charge transfer. Accordingly, corrosion of the signal lines SL1 to SL12 can be reduced or minimized and delayed even when an impurity such as moisture, electrolyte, and the like is permeated into the wiring portion WP depending on the peripheral environment.

Referring to FIG. 1, gaps between the signal lines SL1 to SL12 may be dependent on a change characteristic of the average voltages and the signals of the signal lines SL1 to SL12 to reduce the intensity of the electric field and corrosion of the signal lines SL1 to SL12. This will be described hereinafter.

In the first group GR1 and the third group GR3 in the wiring portion WP, a gap between adjacent signal lines SL1 to SL12 may be dependent on an average voltage difference, which is a difference between average voltages, of signals transmitted by the adjacent signal lines SL1 to SL12. That is, a gap between adjacent signal lines SL1 to SL12 may be increased or at least maintained as the average voltage difference between the adjacent signal lines SL1 to SL12 is increased. Further, in the first group GR1 and the third group GR3, an average voltage difference of two adjacent signal lines SL1 to SL12 may be divided into a plurality of stages. Gaps between adjacent signal lines SL1 to SL12 in the same stage may be set to be constant, and gaps between signal lines SL1 to SL12 in a stage in which the average voltage difference is higher may be relatively wide (e.g. set to be wide).

For example, referring to FIG. 1, in the first group GR1, when an average voltage of a signal transmitted by the signal line SL1 during one frame is −9 V, an average voltage of a signal transmitted by the signal line SL3 during one frame is −5 V, and an average voltage of a signal transmitted by the signal line SL2 during one frame is close to −9 V while between −9 V and −5 V, an average voltage difference between the signal line SL2 and the signal line SL3 is greater than an average voltage difference between the signal line SL1 and the signal line SL2. Accordingly, a gap W1 between the signal line SL1 and the signal line SL2 may be smaller than a gap W2 between the signal line SL2 and the signal line SL3. The gap W1 may be, for example, 20 um to 50 um, and the gap W2 may be, for example, 120 um to 150 um. In some embodiments, when the voltage of the signal transmitted by the signal line SL2 equals the voltage of the signal transmitted by the signal line SL1 during most of the continuous time of a frame even through the average voltage of the signal transmitted by the signal line SL2 is higher than the average voltage of the signal transmitted by the signal line SL1, the gap W1 between the signal line SL1 and the signal line SL2 may be reduced or minimized to an allowable gap of a wire patterning process limit.

When an average voltage of the signal transmitted by the signal line SL4 during one frame is −4.5 V, an average voltage difference between the signal line SL3 and the signal line SL4 may be almost 0.5 V. Accordingly, a gap W3 between the signal line SL3 and the signal line SL4 may be smaller than the gap W2 between the signal line SL2 and the signal line SL3. The gap W3 may be, for example, 20 um to 50 um, and the gap W3 may be equal to or greater than the gap W1. Similarly, the gap W3 may be reduced or minimized to an allowable gap of a wire patterning process limit.

In the third group GR3, when an average voltage of signals transmitted by the signal line SL10, the signal line SL11, and the signal line SL12 during one frame is 6.7 V and an average voltage of a signal transmitted by the signal line SL9 during one frame is slightly lower than 6.7 V, an average voltage difference between the signal line SL9 and the signal line SL11 is greater than 0, and an average voltage difference between the signal line SL10 and the signal line SL11 and an average voltage difference between the signal line SL11 and the signal line SL12 become almost 0. Accordingly, a gap W9 between the signal line SL9 and the signal line SL10 may be greater than a gap W10 between the signal line SL10 and the signal line SL11 and a gap W11 between the signal line SL11 and the signal line SL12. The gap W9 may be, for example, 50 um to 80 um, and the gap W10 and the gap W11 may be, for example, 20 um to 50 um. The gap W10 and the gap W11 may be reduced or minimized to an allowable gap of a wire patterning process limit.

The gap W9 may be equal to or greater than the above-described gap W1.

As described, in the first group GR1 and the third group GR3, which are groups in which voltages of signals transmitted by signal lines are constant for a significant amount of one frame, when an average voltage difference between the adjacent signal lines SL1 to SL4 and SL9 to SL12 is high, gaps between the adjacent signal lines SL1 to SL4 and SL9 to SL12 are set to be wider to reduce the intensity of an electric field between the signal lines SL1 to SL4 and SL9 to SL12. Accordingly, the degree of corrosion of the signal lines SL1 to SL4 and SL9 to SL12 can be reduced and the corrosion can be delayed.

Further, an average voltage difference between the adjacent signal lines SL1 to SL4 and SL9 to SL12 in the first group GR1 and the third group GR3 may be divided into stages to set gaps between the adjacent signal lines SL1 to SL4 and SL9 to SL12. For example, a gap between the adjacent signal lines SL1 to SL4 and SL9 to SL12 is set to be a first gap (e.g., about 20 um to 50 um) when a voltage difference between the adjacent signal lines SL1 to SL4 and SL9 to SL12 is lower than a first constant voltage (e.g., about 1 V), a gap between the adjacent signal lines SL1 to SL4 and SL9 to SL12 is set to a second gap (e.g., about 120 um to 150 um) when a voltage difference between the adjacent signal lines SL1 to SL4 and SL9 to SL12 is a second constant voltage (e.g., 4 V) that is greater than the first constant voltage, and a gap between the adjacent signal lines SL1 to SL4 and SL9 to SL12 is set to a third gap (e.g., about 50 um to 80 um) that is between the first gap and the second gap when a voltage difference between the adjacent signal lines SL1 to SL4 and SL9 to SL12 is between the first constant voltage and the second constant voltage.

In the second group GR2, the signal lines SL5 to SL12 are clock signals that vary between a high voltage level and a low voltage level with a period of several horizontal periods, and referring to FIG. 3, signals of adjacent signal lines SL5 to SL8 have opposite polarities for most of time such that the signal lines SL5 to SL12 of the second group GR2 may have a high voltage difference for a relatively longer period of time than in the first group GR1 and the third group GR3. Thus, the gaps W5, W6, and W7 between the signal lines SL5 to SL8 in the second group GR2 are relatively large (e.g. set to be as wide as possible) to delay corrosion of the signal lines SL5 to SL8 such that the signal lines SL5 to SL8 may have the widest gap in the wiring portion WP. The gaps W5, W6, and W7 may be, for example, 120 um to 150 um. The gaps W5, W6, and W7 may be equal to or greater than the above-described gap W2.

Because signals transmitted by the signal lines SL1 to SL12 in the different groups GR1, GR2, and GR3 have difference characteristics, the gaps W4 and W8 between the adjacent groups GR1, GR2, and GR3 may be the widest in the wiring portion WP in order to reduce an electric field between the signal lines SL4, SL5, SL8, and SL9 that are disposed at outer edges of the groups GR1, GR2, and GR3 and adjacent to each other and delay corrosion of the signal lines SL4, SL5, SL8, and SL9. The gaps W4 and W8 may be, for example, 120 um to 150 um, and may be equal to or greater than the above-described gap W2 or the gaps W5, W6, and W7 between the adjacent signal lines SL5 to SL8 of the second group GR2.

Widths of the signal lines SL4, SL5, SL8, and SL9 disposed at the outer edges of the groups GR1, GR2, and GR3 may be greater than widths of other signal lines SL4, SL5, SL8, and SL9 of the wiring portion WP, and in this case, corrosion of the signal lines SL4, SL5, SL8, and SL9 disposed at the outer edge of the groups GR1, GR2, and GR3 can be further delayed.

Figure 5:
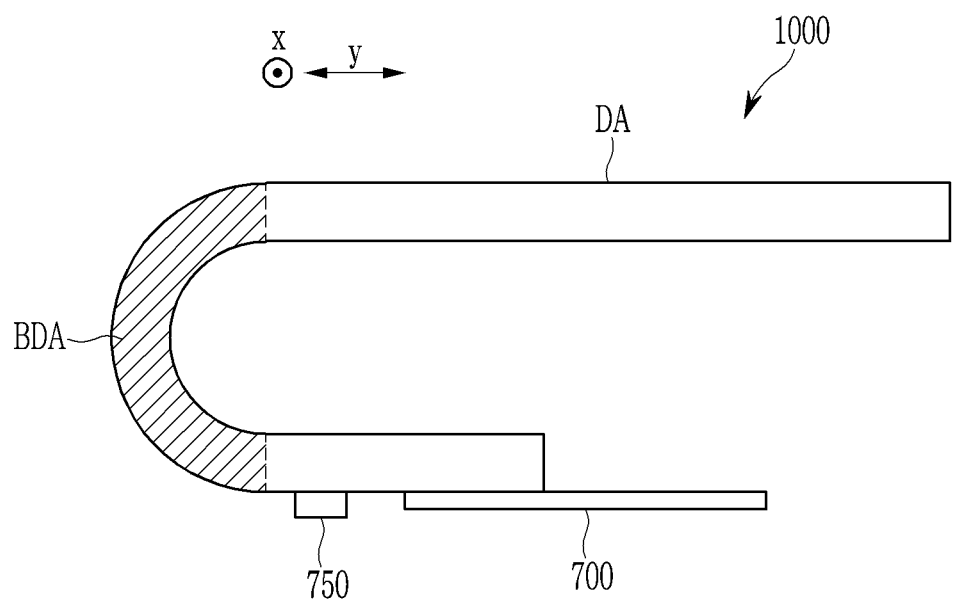
FIG. 5 shows the display device in a bent state according to the exemplary embodiment.

Hereinafter, a display device according to an exemplary embodiment will be described with reference to FIG. 5 and FIG. 6, together with FIG. 1 to FIG. 4.

A display device according to an exemplary embodiment includes a display panel 1000 that includes a display area DA where an image is displayed and a peripheral area PA that is disposed outside the display area DA, and the display panel 1000 may include a substrate 110. The peripheral area PA may include a first peripheral area PA1 disposed at the periphery of the display area DA and a second peripheral area PA2 that is disposed outside of the first peripheral area PA1.

The substrate 110 may include an insulation material such as glass, plastic, and the like, and may have flexibility. For example, the substrate 110 may include various plastics such as polyethylene terephthalate (PET), polyethylene naphthalate (PEN), polycarbonate (PC), polyarylate (PAR), polyetherimide (PEI), polyethersulfone (PES), or polyimide (PI), a metal thin film, or ultra-thin glass.

The display area DA may display an image on a plane that is parallel with the x-axis direction and the y-axis direction. The display area DA includes a plurality of pixels PX and a plurality of signal lines. The signal lines may include a plurality of gate lines 151 for transmitting a gate signal, a plurality of data lines 171 for transmitting a data signal, and a plurality of driving voltage lines 172 for transmitting a constant voltage. Each gate line 151 substantially extends in the x-axis direction in the display area DA, and may be connected with the gate drivers 400a and 400b. The gate drivers 400a and 400b include the above-stated circuit portions that generate the gate signal. The data line 171 and the driving voltage line 172 extend while crossing the plurality of gate lines 151 in the display area DA. The data line 171 and the driving voltage line 172 may be alternately arranged along the x-axis direction, but this is not restrictive.

Each pixel PX may include at least one switch and a pixel electrode connected to the switch. The switch may be a three-terminal element such as a transistor that is integrated in the display panel 1000. The switch is turned on or turned off according to the gate signal transmitted by the gate line 151, and selectively transmits the data signal transmitted by the data line 171 to the pixel electrode.

The first peripheral area PA1 is an area that is adjacent to the display area DA and surrounds the periphery of the display area DA. The first peripheral area PA1 may include the gate drivers 400a and 400b, a voltage transmission line 176, and a driving voltage transmission line 172M.

The gate drivers 400a and 400b are connected with the plurality of gate lines 151, and thus may apply a gate signal that is scanned from top to bottom or from bottom to top to the gate lines 151. The gate drivers 400a and 400b may be disposed on the substrate 110 together with the plurality of signal lines and the switch disposed in the display area DA. In FIG. 1, the gate drivers 400a and 400b are respectively disposed at the left and right sides with respect to the display area DA, but this is not restrictive, and one of the gate drivers 400a and 400b may be omitted.

The voltage transmission line 176 may transmit a constant voltage such as a common voltage ELVSS while extending along at least three sides such as the left and right sides and the top side of the display area DA. The common voltage ELVSS transmitted by the voltage transmission line 176 may be, for example, −5 V, but this is not restrictive.

The driving voltage transmission line 172M may be disposed adjacent to the bottom side of the display area DA and substantially extend in the x-axis direction. The plurality of driving voltage lines 172 disposed in the display area DA may extend in the first peripheral area PA1 and be connected with the driving voltage transmission line 172M, and thus may receive a driving voltage ELVDD. The driving voltage ELVDD is a constant positive (+) voltage, and for example, may have a voltage level between 4 V and 6 V.

The second peripheral area PA2 is disposed below the first peripheral area PA1, and may include a bending area BDA, a pad portion 70, and a driving portion 750.

The bending area BDA may extend while crossing the display panel 1000 in the x-axis direction in the second peripheral area PA2. Because the display panel 1000 is bent in the bending area BDA and thus a portion disposed further outside than the bending area BDA is bent backward, the portion may not be seen from the front. FIG. 4 shows the display panel 1000 in an unfolded state rather than being bent in the bending area BDA, and FIG. 5 shows the display panel 1000 that is bent in the bending area BDA. A plurality of wires may pass the bending area BDA, and the plurality of wires may substantially extend in the y-axis direction in the bending area BDA.

The bending area BDA may be bendable or in the bent state.

The pad portion 70 is disposed at one edge of the display panel 1000 and may be disposed further outside than the bending area BDA. That is, the bending area BDA may be disposed between the display area DA and the pad portion 70. The pad portion 70 may include the driving portion 750 attached to the substrate 110 and/or a plurality of pads that may be electrically connected with a circuit film 700. A display device according to an exemplary embodiment may further include a driving portion 750 and/or a circuit film 700 that are electrically connected with a display panel 1000 through a pad portion 70.

The driving portion 750 may be disposed on the display panel 1000 as shown in FIG. 1 and FIG. 2, or may be disposed on the circuit film 700. The driving portion 750 may include a driving circuit that generates a driving signal for driving the display panel 1000.

The circuit film 700 may be provided as a film, and may be connected to the pad portion 70 of the display panel 1000. A driver, a timing controller, and the like may be disposed in the circuit film 700.

The voltage transmission line 176 may extend to the second peripheral area PA2 through a first voltage transmission wire 176W that passes the bending area BDA, and thus may be connected to the pad portion 70.

The driving voltage transmission line 172M may extend to the second peripheral area PA2 through a second voltage transmission wire 172W that passes the bending area BDA, and thus may be connected to the pad portion 70.

The data line 171 may extend to the second peripheral area PA2 through a data wire 171W that passes the bending area BDA, and thus may be connected to the driving portion 750.

The voltage transmission line 176, the data line 171, the driving voltage line 172, and the driving voltage transmission line 172M, each extended as one signal line in a plan view, may be disposed in one conductive layer, or different portions disposed in a plurality of conductive layers may be electrically connected with each other.

The display panel 1000 may further include a wiring portion WPa that passed the bending area BDA. The wiring portion WPa may have the same structure as the above-described wiring portion WP. The wiring portion WPa may further include a connection wire WPa2 that is connected with the pad portion 70. Accordingly, signals of the wiring portion WPa may have a structure in which the signals are connected with the pad portion 70 and thus receive respective signals. The pad portion 70 may transmit a plurality of signals from the circuit film 700 to the wiring portion WPa. Some of the signal lines of the wiring portion WPa, connected with the pad portion 70, may be connected to the driving portion 750 through the connection wire WPa1, and others of the signal lines of the wiring portion WPa may pass the bending area BDA and thus be connected with the gate drivers 400a and 400b in the first peripheral area PA1 to transmit driving signals to the gate drivers 400a and 400b.

The wiring portion WPa may include wires disposed at the outermost edge in the bending area BDA as shown in FIG. 4. For example, the plurality of data wires 171W connected with the data line 171 may be disposed in a center area of the bending area BDA, and the first voltage transmission wire 176W and the second voltage transmission wire 172W may be disposed in the left side and the right side of the center area of the bending area BDA, respectively. The second voltage transmission wire 172W may be disposed between the first voltage transmission wire 176W and the plurality of data wires 171W, but this is not restrictive. The wiring portion WPA may be disposed between the first voltage transmission wire 176W and the edge of the substrate 110.

Such alignment of the wires in the bending area BDA will be described with reference to FIG. 6. FIG. 6 shows a structure of the left side of the bending area BDA shown in FIG. 4.

Figure 6:
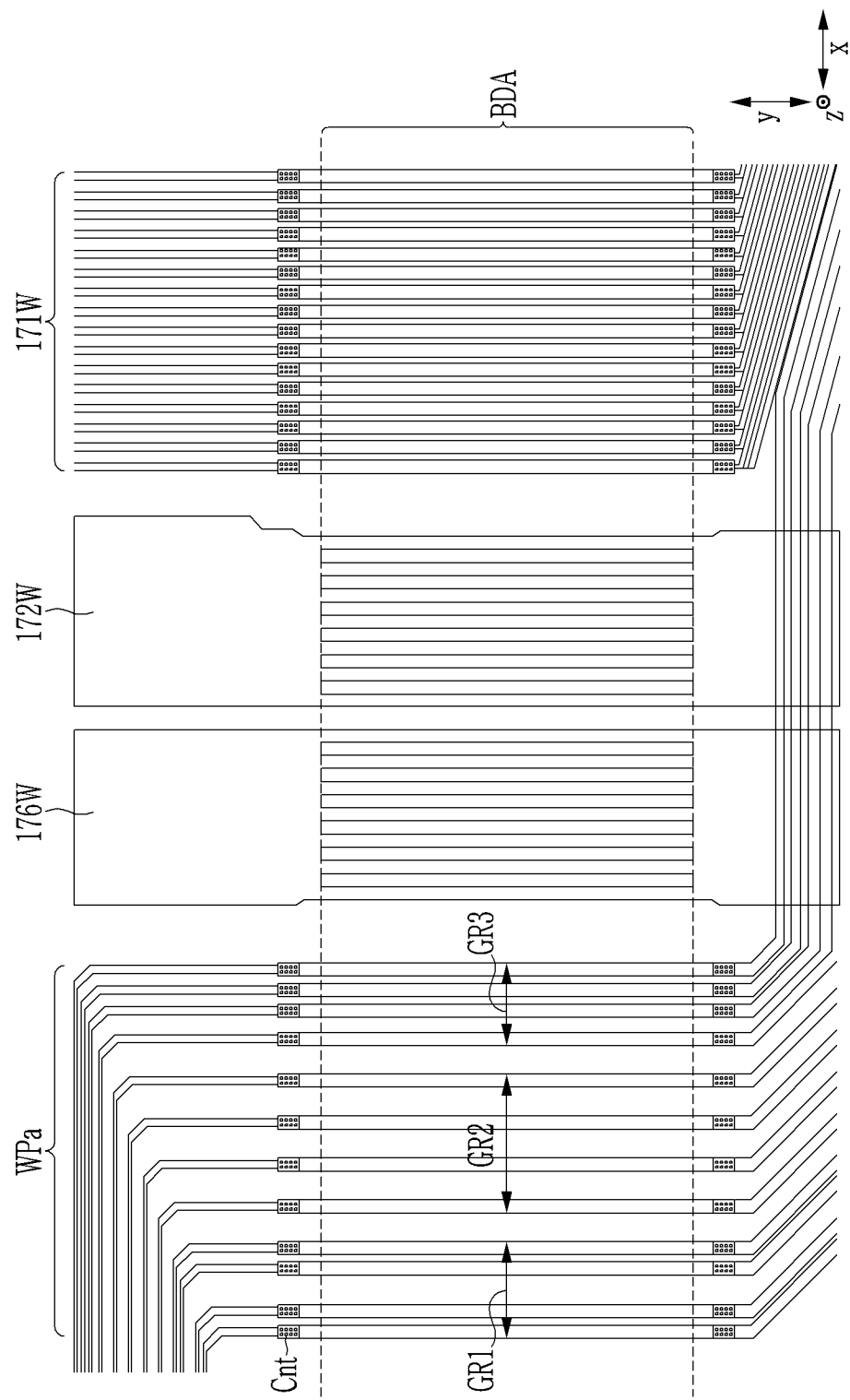
FIG. 6 is an enlarged view of a part of a bending area of the display device according to the exemplary embodiment.

Referring to FIG. 6, the plurality of second voltage transmission wires 172W may be disposed in the left side of the plurality of data wires 171W. The plurality of second voltage transmission wires 172W are connected with each other in upper and lower peripheral areas of the bending area BDA, and may be formed as a single wire at the outside of the bending area BDA. The plurality of first voltage transmission wires 176W may be disposed in the left side of the second voltage transmission wire 172W. The plurality of first voltage transmission wires 176W are also connected with each other in upper and lower peripheral areas of the bending area BDA, and may be formed as a single wire at the outside of the bending area BDA.

The wiring portion WPa that includes the plurality of signal lines SL1 to SL12 included in the first, second, and third groups GR1, GR2, and GR3 as described above may be disposed between the plurality of first voltage transmission wires 176W and the edge of the substrate 110. The signal lines SL1 to SL12 included in the wiring portion WPa may be connected with wires in another conductive layer through a contact hole Cnt in the upper and lower peripheral areas of the bending area BDA. That is, in the wiring portion WPa, a conductive layer in the bending area BDA and a conductive layer in the outer area of the bending area BDA may be different from each other, and the two conductive layers extend while being electrically connected with each other through the contact hole Cnt and thus may form a single signal line. A structure at the periphery of such a contact hole Cnt will be described later.

A detailed structure of the display device according to the exemplary embodiment will now be described with reference to FIG. 7 to FIG. 13, together with the above-described drawings.

A barrier layer 120 may be disposed on the substrate 110. The barrier layer 120 may include a plurality of layers as shown in the drawing (e.g. FIG. 8, FIG. 9, FIG. 11, and FIG. 13), or may be provided as a single layer.

An active pattern 130 is disposed on the barrier layer 120. The active pattern 130 may include channel regions 131a, 131b, 131c_1, 131c_2, 131d_1, 131d_2, 131e, 131f, and 131g, respectively forming channels of a plurality of transistors T1, T2, T3_1, T3_2, T4_1, T4_2, T5, T6, and T7 included in each pixel, and a conductive region. The conductive region of the active pattern 130 includes source regions 136a, 136b, 136c_1, 136c_2, 136d_1, 136d_2, 136e, 136f, and 136g and drain regions 137a, 137b, 137c_1, 137c_2, 137d_1, 137d_2, 137e, 137f, and 137g, respectively disposed at opposite sides of the respective channel regions 131a, 131b, 131c_1, 131c_2, 131d_1, 131d_2, 131e, 131f, and 131g.

The active pattern 130 may include amorphous silicon, polysilicon, or an oxide semiconductor.

A first insulation layer 121 is disposed on the active pattern 130, and a first conductive layer may be disposed on the first insulation layer 121. The first conductive layer may include a plurality of scan lines 151a, 151b, and 151c transmitting a scan signal, a control line 151d transmitting an emission control signal, and a driving gate electrode 155a. The plurality of scan lines 151a, 151b, and 151c and the control line 151d may substantially extend in the x-axis direction. The plurality of scan lines 151a, 151b, and 151c and the control line 151d may be included in the above-described gate line 151.

A second insulation layer 122 may be disposed on the first conductive layer and the first insulation layer 121, and a second conductive layer may be disposed on the second insulation layer 122. The second conductive layer may include a storage line 166 and an initialization voltage line 169 transmitting an initialization voltage. The storage line 166 may include an expansion portion 166a that overlaps the driving gate electrode 155a.

A third insulation layer 123 may be disposed on the second conductive layer and the second insulation layer 122.

At least one of the barrier layer 120, the first insulation layer 121, the second insulation layer 122, and the third insulation layer 123 may include an inorganic insulation material such as a silicon nitride (SiNx), a silicon oxide (SiOx), a silicon oxynitride (SiON), and/or an organic insulation material. Some or all of the first insulation layer 121, the second insulation layer 122, and third insulation layer 123 may include a plurality of contact holes 61, 62, 63, 64, 65, 67, 68, and 69.

Figure 11:
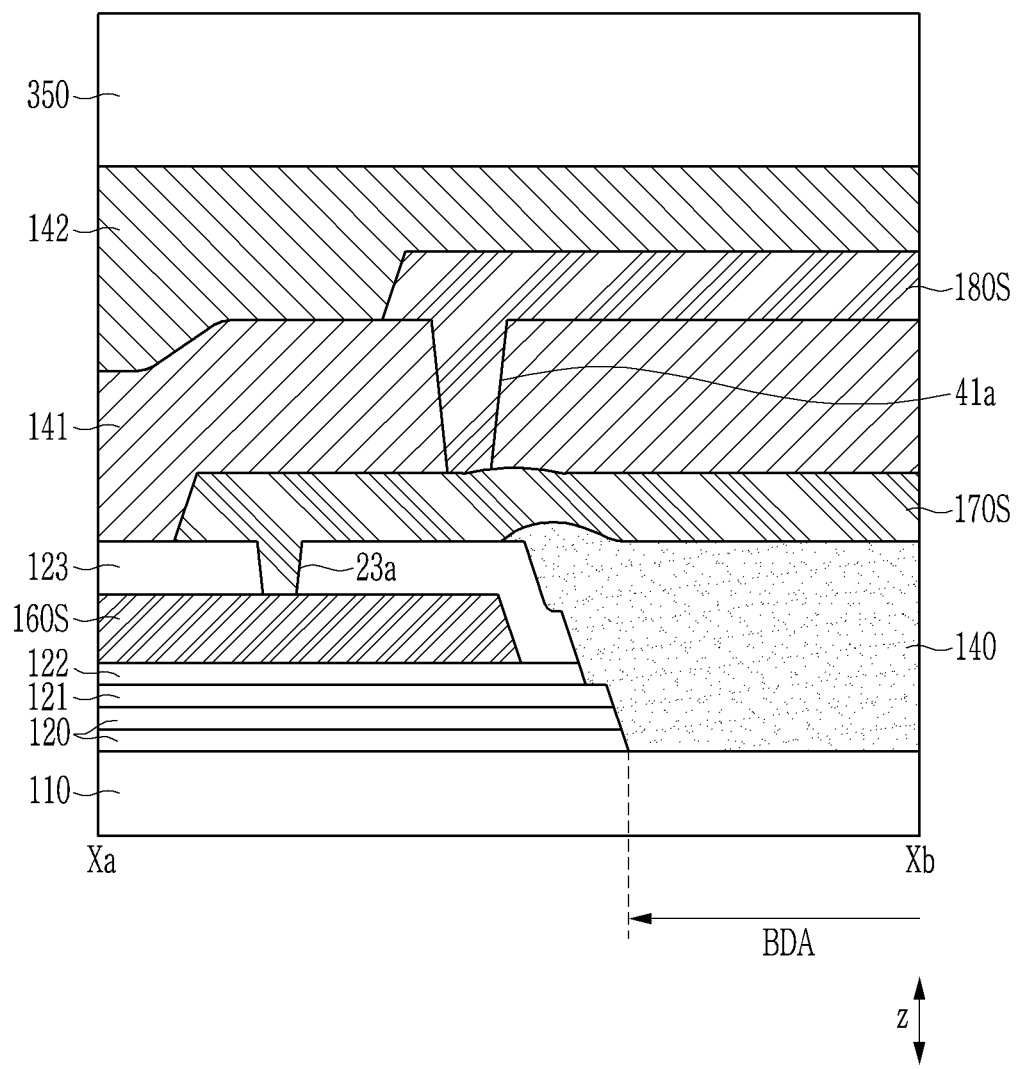
FIG. 11 is a cross-sectional view of the display device of FIG. 10, taken along the line Xa-Xb.
Figure 13:
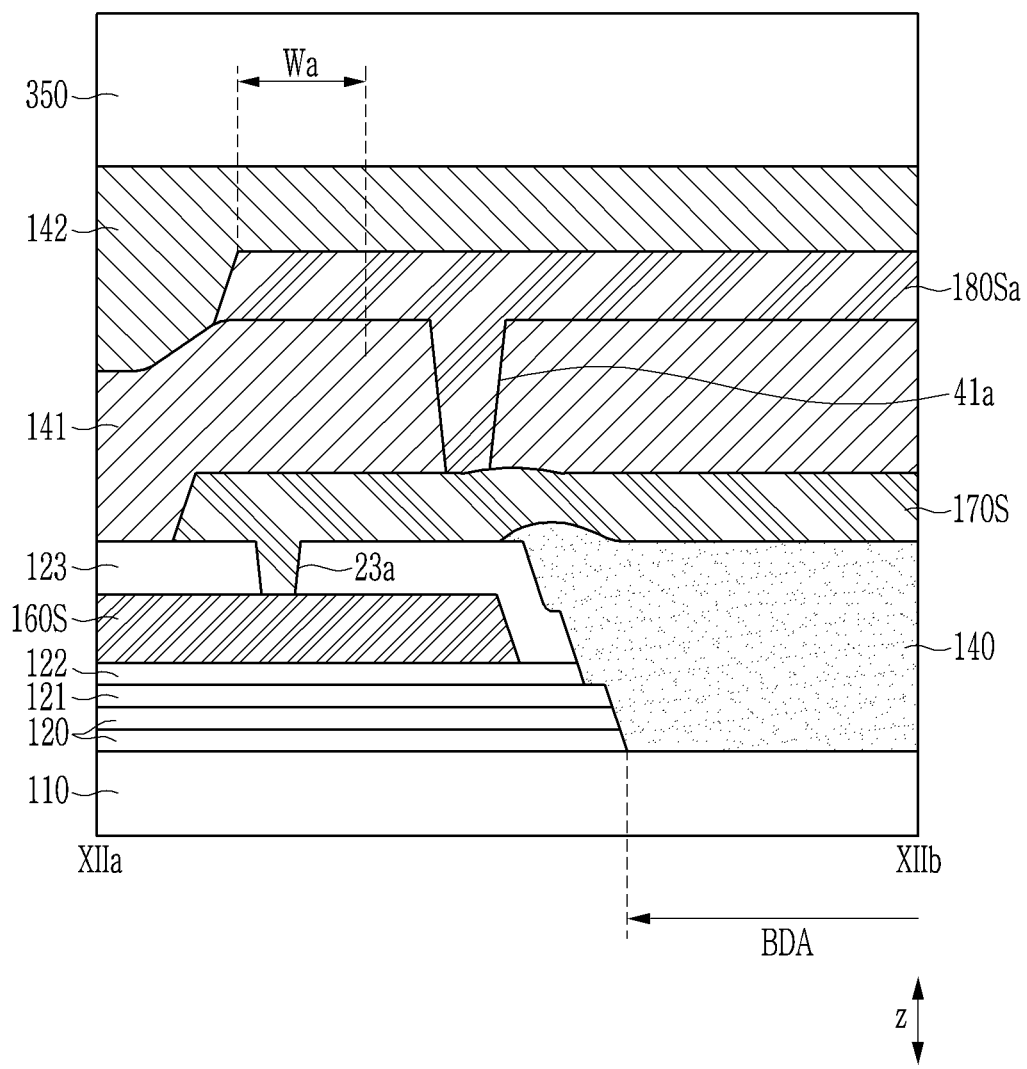
FIG. 13 is a cross-sectional view of the display device of FIG. 12, taken along the line XIIa-XIIb.

A fourth insulation layer 140 shown in FIG. 11 and FIG. 13 may be disposed on the third insulation layer 123. The fourth insulation layer 140 is substantially disposed in the bending area BDA, and may protect the bending area BDA by covering the substrate 110 at which the barrier layer 120, the first insulation layer 121, the second insulation layer 122, and the third insulation layer 123 are removed.

A third conductive layer may be disposed on the third insulation layer 123 and the fourth insulation layer 140. The third conductive layer may include a plurality of connection members 74, 75, and 79 connected with the source regions 136a, 136b, 136c_1, 136c_2, 136d_1, 136d_2, 136e, 136f, and 136g or the drain regions 137a, 137b, 137c_1, 137c_2, 137d_1, 137d_2, 137e, 137f, and 137g of the active pattern 130, and the voltage transmission line 176, the data line 171, and the driving voltage line 172 that are disposed in the first peripheral area PA1 and the display area DA.

The data line 171 and the driving voltage line 172 may substantially extend in the y-axis direction in a plan view, and thus may cross the plurality of scan lines 151a, 151b, and 151c. The expansion portion 166a of the storage line 166 may be connected with the driving voltage line 172 through the contact hole 68 and thus may receive the driving voltage ELVDD.

The first transistor T1 includes the channel region 131a, the source region 136a, the drain region 137a, and the driving gate electrode 155a. The driving gate electrode 155a may be connected with the connection member 74 through the contact hole 61. The contact hole 61 may be disposed in a hole 51 included in the expansion portion 166a.

The second transistor T2 includes the channel region 131b, the source region 136b, the drain region 137b, and a gate electrode 155b, which is a part of the scan line 151a. The source region 136b is connected with the data line 171 through the contact hole 62, and the drain region 137b is connected with the source region 136a of the first transistor T1.

Third transistors T3_1 and T3_2 may include an upper third transistor T3_1 and a lower third transistor T3_2 that are connected with each other. The upper third transistor T3_1 includes the channel region 131c_1, the source region 136c_1, the drain region 137c_1, and a gate electrode 155c_1, which is a part of the scan line 151a. The drain region 137c_1 is connected with the connection member 74 through the contact hole 63. The lower third transistor T3_2 includes the channel region 131c_2, the source region 136c_2, the drain region 137c_2, and a gate electrode 155c_2, which is a part of the scan line 151a.

Fourth transistors T4_1 and T4_2 may include a left fourth transistor T4_1 and a right fourth transistor T4-2 that are connected with each other. The left fourth transistor T4_1 includes the channel region 131d_1, the source region 136d_1, the drain region 137d_1, and a gate electrode 155d_1, which is a part of the scan line 151b. The drain region 137d_1 is connected with the drain region 137c_1 of the upper third transistor T3_1, and is connected with the connection member 74 through the contact hole 63. The right fourth transistor T4_2 includes the channel region 131d_2, the source region 136d_2, the drain region 137d_2, and a gate electrode 155d_2, which is a part of the scan line 151b. The drain region 137d_2 is connected with the source region 136d_1 of the left fourth transistor T4_1, and the source region 136d_2 is connected with the connection member 75 through the contact hole 65. The connection member 75 may be electrically connected with the initialization voltage line 169 through the contact hole 64.

A fifth transistor T5 includes the channel region 131e, the source region 136e, the drain region 137e, and a gate electrode 155e, which is a part of the control line 151d. The source region 136e is connected with the driving voltage line 172 through the contact hole 67, and the drain region 137e is connected with the source region 136a of the first transistor T1.

A sixth transistor T6 includes the channel region 131f, the source region 136f, the drain region 137f, and a gate electrode 155f, which is a part of the control line 151d. The source region 136f is connected with the drain region 137a of the first transistor T1, and the drain region 137f is connected with the connection member 79 through the contact hole 69.

A seventh transistor T7 includes the channel region 131g, the source region 136g, the drain region 137g, and a gate electrode 155g, which is a part of the scan line 151c. The source region 136g is connected with the drain region 137f of the sixth transistor T6, and the drain region 137g is connected with the connection member 75 through the contact hole 65 and thus receives the initialization voltage.

A capacitor Cst included in each pixel may include the driving gate electrode 155a and the expansion portion 166a of the storage line 166 that overlap each other, while interposing the second insulation layer 122 therebetween, as two terminals.

A fifth insulation layer 141 may be disposed on the third insulation layer 123, the fourth insulation layer 140, and the third conductive layer.

Figure 9:
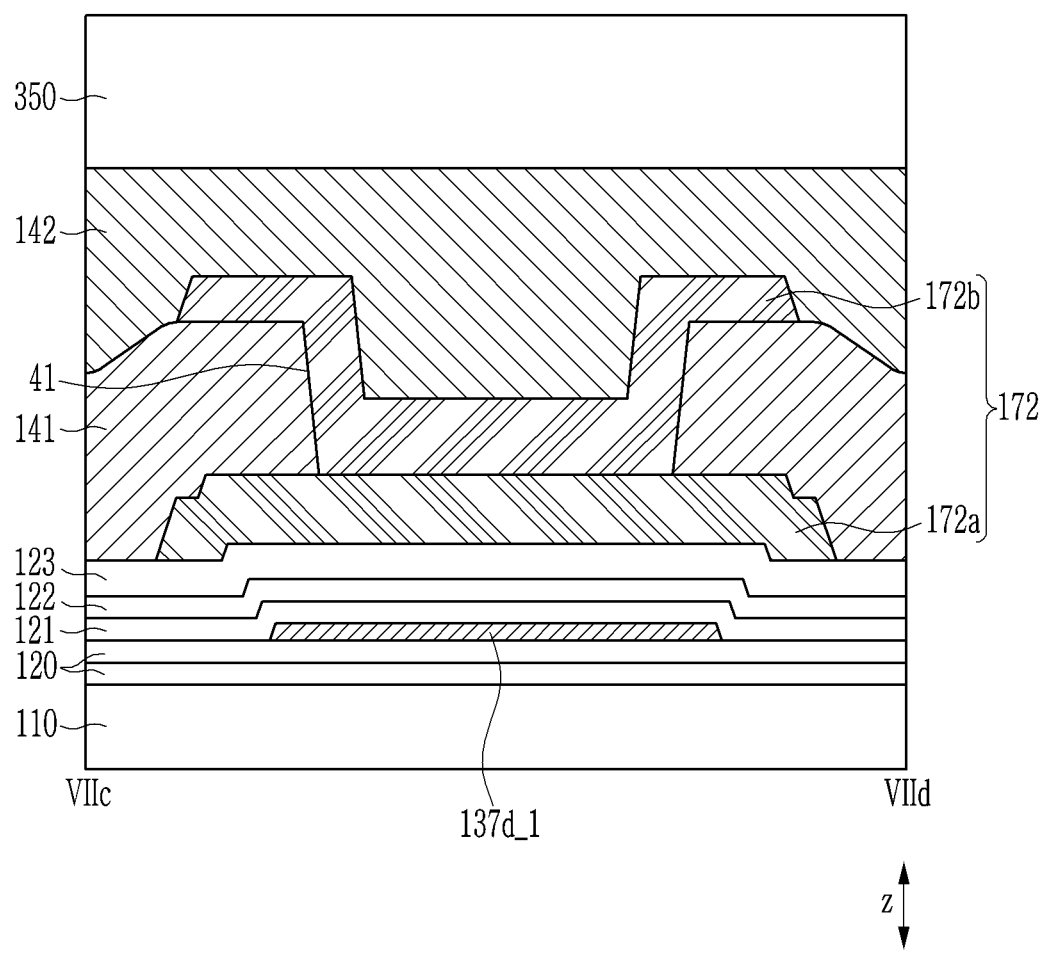
FIG. 9 is a cross-sectional view of the pixel according to the exemplary embodiment of FIG. 7, taken along the line VIIc-VIId.

A fourth conductive layer may be disposed on the fifth insulation layer 141. Some signal lines disposed in the display panel 1000 may include a plurality of wires that are disposed in at least two conductive layers. For example, the driving voltage line 172 may include a first wire 172a disposed in the third conductive layer and a second wire 172b disposed in the fourth conductive layer, as shown in FIG. 9. The first wire 172a and the second wire 172b may be electrically connected with each other through a plurality of contact holes 41 in the fifth insulation layer 141 and extend in parallel with each other, and may have substantially the same plane shape in a plan view.

A sixth insulation layer 142 may be disposed on the fifth insulation layer 141 and the fourth conductive layer.

At least one of the fourth insulation layer 140, the fifth insulation layer 141, and the sixth insulation layer 142 may include an inorganic insulation material and/or an organic insulation material such as a polyimide, an acryl-based polymer, and a siloxane-based polymer.

At least one of the first conductive layer, the second conductive layer, the third conductive layer, and the fourth conductive layer may include at least one of metals such as copper (Cu), aluminum (Al), magnesium (Mg), silver (Ag), gold (Au), platinum (Pt), palladium (Pd), nickel (Ni), neodymium (Nd), iridium (Ir), molybdenum (Mo), tungsten (W), titanium (Ti), chromium (Cr), tantalum (Ta), and/or an alloy thereof. Each of the first conductive layer, the second conductive layer, the third conductive layer, and the fourth conductive layer may be a single layer or a multilayer.

A pixel electrode layer may be disposed on the sixth insulation layer 142. The pixel electrode layer may include a pixel electrode 191 and a pixel conductive pattern 192 disposed in each pixel PX of the display area DA. The pixel electrode 191 may be connected with the connection member 79 through a contact hole 89 of the fifth insulation layer 141 and the sixth insulation layer 142, and thus may receive a data voltage. The pixel conductive pattern 192 may transmit the initialization voltage. The pixel electrode layer may include a semi-transmissive conductive material or a reflective conductive material.

A pixel defining layer 350 may be disposed on the sixth insulation layer 142. The pixel defining layer 350 may include an opening 351 disposed on the pixel electrode 191. The pixel defining layer 350 may include an organic insulation material such as a polyacryl-based resin, a polyimide-based resin, and the like.

An emission layer 370 is disposed on the pixel electrode 191. The emission layer 370 may include a portion that is disposed in the opening of the pixel defining layer 350. The emission layer 370 may include an organic emission material or an inorganic emission material.

A common electrode 270 is disposed on the emission layer 370. The common electrode 270 is also formed on the pixel defining layer 350 and thus may be continuously formed throughout the plurality of pixels PX. The common electrode 270 may be connected with the voltage transmission line 176 in the first peripheral area PA1 and thus may receive the common voltage ELVSS. The common electrode 270 may include a conductive transparent material.

The pixel electrode 191, the emission layer 370, and the common electrode 270 of each pixel PX form a light emitting diode ED, and one of the pixel electrode 191 and the common electrode 270 becomes a cathode and the other becomes an anode.

Figure 7:
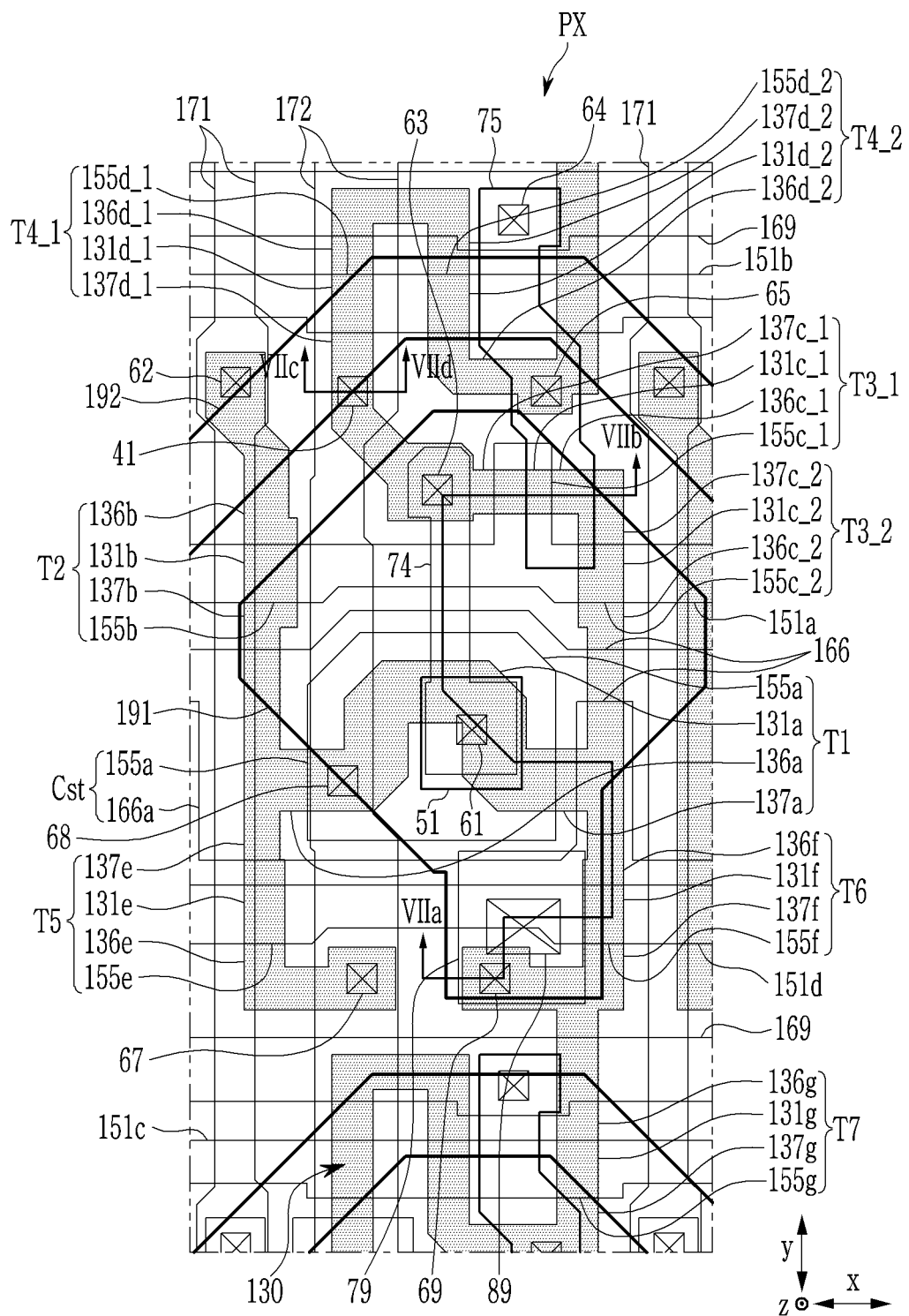
FIG. 7 is a plan layout view of a pixel of the display device according to the exemplary embodiment.
Figure 8:
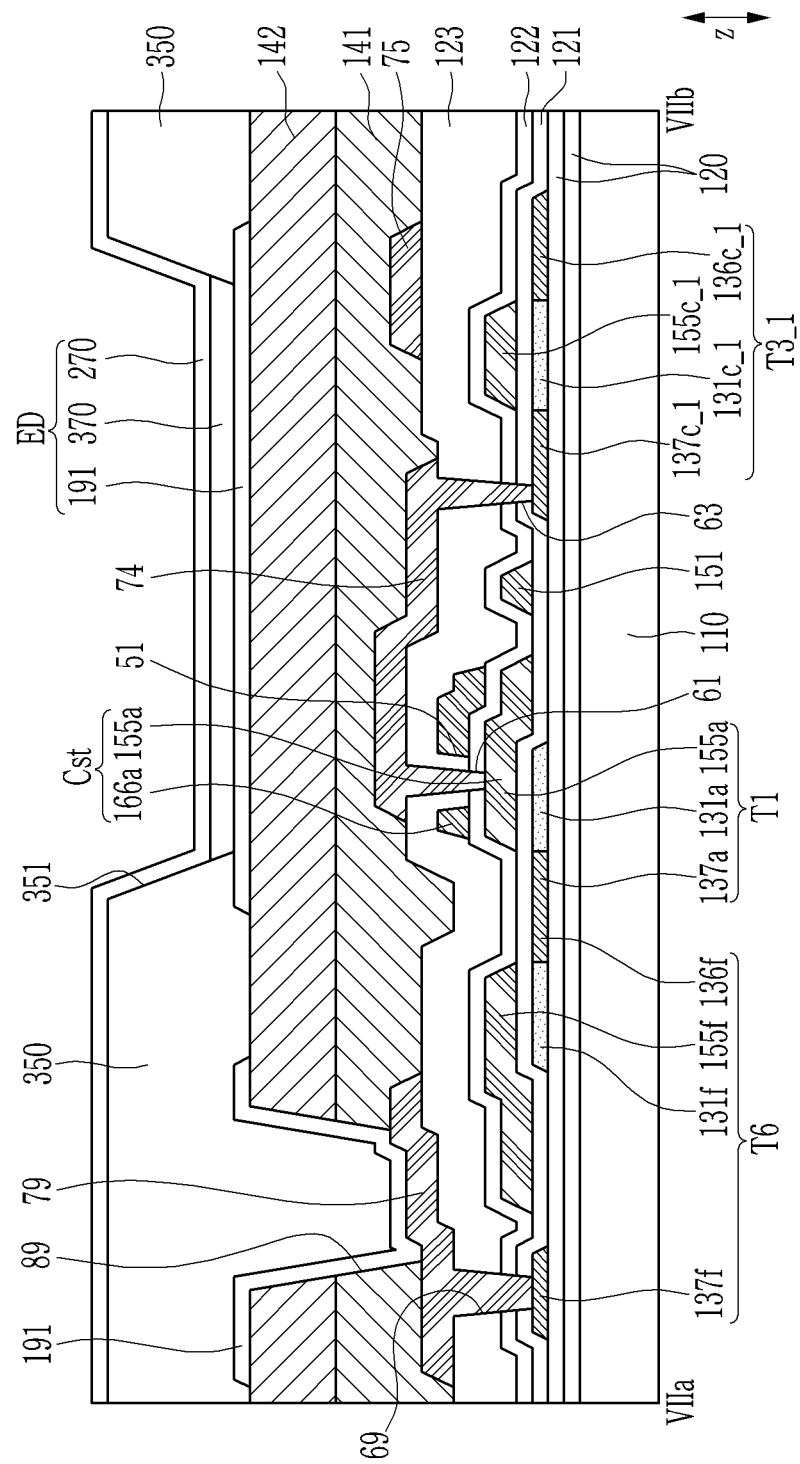
FIG. 8 is a cross-sectional view of the pixel according to the exemplary embodiment of FIG. 7, taken along the line VIIa-VIIb.

Hereinafter, a cross-sectional structure of the wiring portion of the display device will be described with reference to FIG. 10 to FIG. 13, together with FIG. 7 to FIG. 9. The same description of the same components as those described above will be omitted and the differences will be mainly described.

Figure 10:
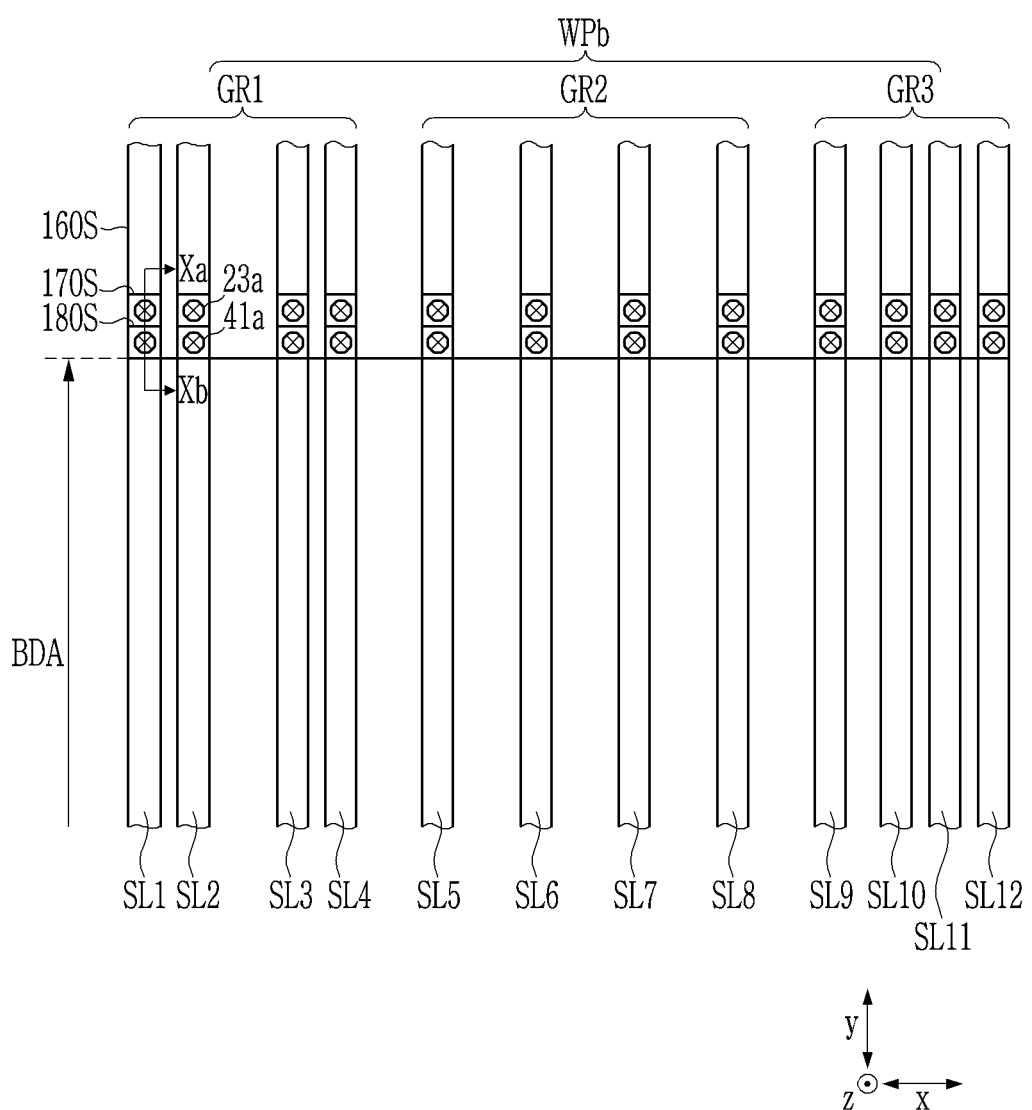
FIG. 10 is a plan layout view of a wiring portion that is disposed in a peripheral area of a display device according to an exemplary embodiment.

Referring to FIG. 10 and FIG. 11, a wiring portion WPb according to the exemplary embodiment is almost the same as the above-described wiring portion WP or the wiring portion WPa, but for example, may include a portion disposed in the bending area BDA included in the display device according to the exemplary embodiment.

At least a part of signal lines SL1 to SL12 included in the wiring portion WPb may include a wire 170S disposed on the above-described third conductive layer and/or a wire 180S disposed on the fourth conductive layer, and a wire 160S disposed in the second conductive layer. The wire 170S of the third conductive layer and the wire 180S of the fourth conductive layer may be disposed in the bending area BDA, and the wire 160S of the second conductive layer may be disposed outside the bending area BDA. The wire 170S of the third conductive layer and the wire 180S of the fourth conductive layer extend in parallel with each other in a cross-sectional view in the bending area BDA, and may overlap each other in a plan view.

The wire 180S of the fourth conductive layer is electrically connected with the wire 170S of the third conductive layer through a first contact portion 41a (which may be a contact hole of the fifth insulation layer 141) in the upper and lower peripheral areas of the bending area BDA in the outer area of the bending area BDA, and thus may transmit the same signal as the wire 170S.

The wire 170S of the third conductive layer is electrically connected with the wire 160S of the second conductive layer through a second contact portion 23a (which may be a contact hole of the third insulation layer 123) in the upper and lower peripheral area of the bending area BDA and thus may transmit the same signal as the wire 160S. In a plan view, the second contact portion 23a may be disposed apart from the first contact portion 41a in the y-axis direction.

An upper end or a lower end of the wire 180S of the fourth conductive layer, disposed topmost of the wires of the signal lines SL1 to SL12, is disposed between the first contact portion 41a and the second contact portion 23a in a plan view, and thus the wire 180S of the fourth conductive layer may not overlap the second contact portion 23a in a plan view.

Figure 12:
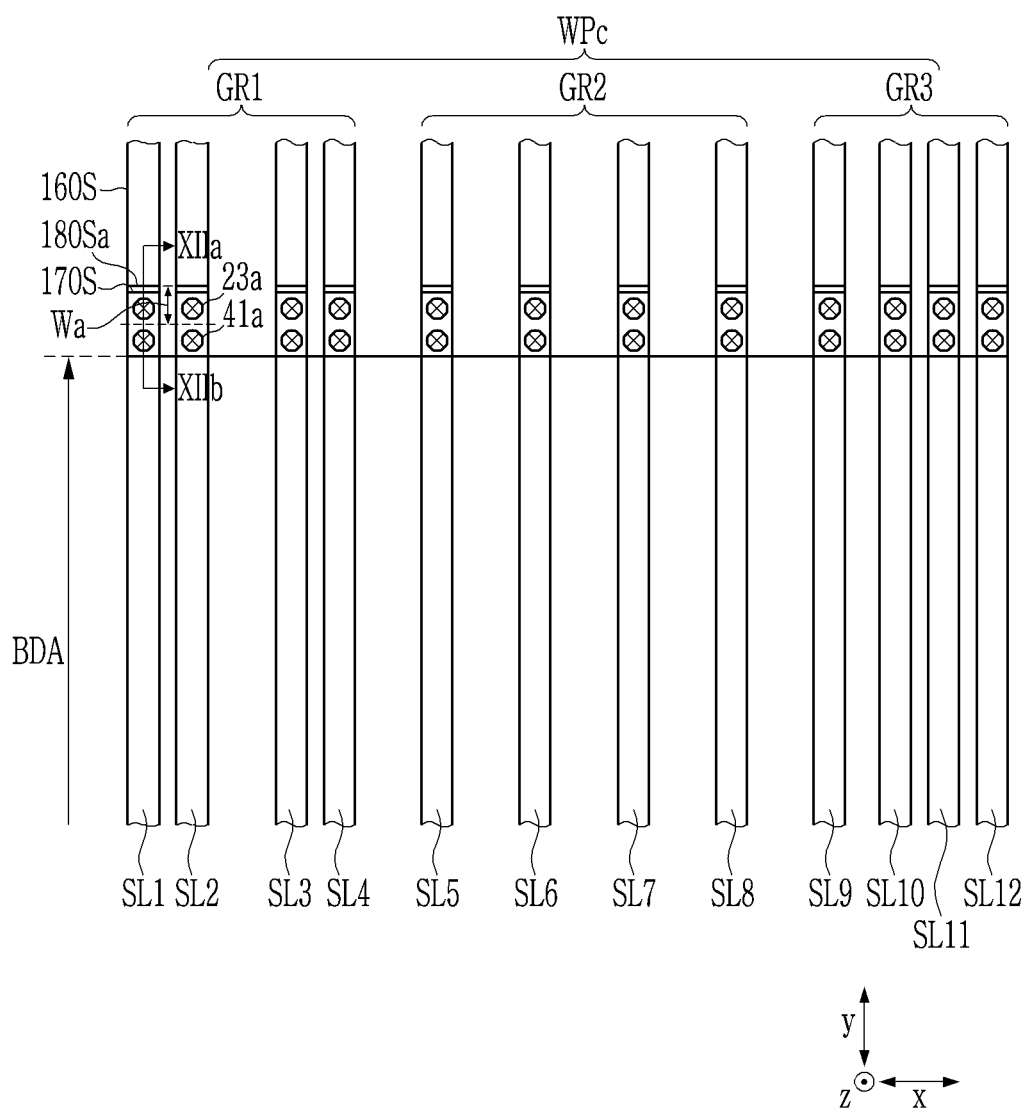
FIG. 12 is a plan layout view of a wiring portion that is disposed in a peripheral area of a display device according to an exemplary embodiment.

Next, referring to FIG. 12 and FIG. 13, a wiring portion WPc included in the display device according to the exemplary embodiment substantially has the same structure as the above-described wiring portion WPb, except for including a wire 180Sa instead of including the wire 180S of the fourth conductive layer. The wire 180Sa is almost the same as the wire 180S, but the wire 180Sa disposed in the fourth conductive layer in the upper and lower peripheral areas of the bending area BDA may overlap the first contact portion 41a and the second contact portion 23a while covering them. Compared to the exemplary embodiment of FIG. 10 and FIG. 11, the wire 180Sa disposed in the fourth conductive layer that is included in at least a part of the signal lines SL1 to SL12 of the wiring portion WPc extends in a direction that is away from the bending area BDA. In the wire 180Sa, a length Wa from a location between the first contact portion 41a and the second contact portion 23a to an end of the wire 180Sa, which is a further extended portion, may be about 150 um to about 250 um. Accordingly, even of corrosion occurs in the signal lines SL1 to SL12, the corrosion may be delayed due to the longer wire 180Sa.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims and their equivalents.

What is claimed is:

1. A display device comprising:
   a display area comprising a plurality of pixels;
   a peripheral area that is outside the display area; and
   a wiring portion in the peripheral area and including a plurality of signal lines that are adjacent to each other,
   wherein, in the wiring portion, the plurality of signal lines are arranged along a first direction,
   each of the plurality of signal lines extends in a second direction that is different from the first direction, and
   the plurality of signal lines are arranged in an order of average voltages of signals respectively transmitted by the plurality of signal lines during one frame,
   wherein a gap between adjacent signal lines from among the plurality of signal lines is dependent on a difference between average voltages of the signals transmitted by the adjacent signal lines.

2. The display device of claim 1, wherein an order of the signal lines having the same average voltage as each other from among the plurality of signal lines is variable.

3. The display device of claim 1, wherein the plurality of signal lines comprises:
  a first signal line configured to transmit a first signal of which an average voltage is a first voltage;
  a second signal line configured to transmit a second signal having a second voltage during a continuous time of 9/10 of one frame or more, and a third voltage that is different from the second voltage during a remaining continuous time of the frame; and
  a third signal line configured to transmit a third signal of which an average voltage is a fourth voltage that is different from the first voltage,
  wherein the second voltage equals the first voltage or is between the first voltage and the fourth voltage, and
  the second signal line is between the first signal line and the third signal line.

4. The display device of claim 3, wherein
  a difference between the second voltage and the first voltage is smaller than a difference between the second voltage and the fourth voltage, and
  a gap between the second signal line and the first signal line is smaller than a gap between the second signal line and the third signal line.

5. The display device of claim 1, wherein
  the plurality of signal lines comprises a first group, a second group, and a third group that are adjacent to each other,
  a polarity of signals transmitted by the signal lines included in the first group is a first polarity during a continuous time of 9/10 of the frame or more,
  a polarity of signals transmitted by the signal lines included in the third group is a second polarity during a continuous time of 9/10 of the frame or more,
  the signal lines included in the second group transmit clock signals of which voltage levels are changed with a period that is shorter than 1/10 of the frame, and
  the second group is between the first group and the third group.

6. The display device of claim 5, wherein at least one of the first group and the third group includes a signal line for transmitting a signal of which a voltage varies by the frame.

7. The display device of claim 5, wherein a gap between two adjacent groups from among the first group, the second group, and the third group is at least as wide as a widest gap from gaps between adjacent signal lines from among the plurality of signal lines.

8. The display device of claim 1, wherein
  when a difference between the average voltages of two adjacent signal lines from among the plurality of signal lines is a first constant voltage or less, a gap between the two adjacent signal lines is a first gap,
  when a difference between the average voltages of two adjacent signal lines from among the plurality of signal lines is a second constant voltage or more, a gap between the two adjacent signal lines is a second gap that is greater than the first gap, and
  when a difference between the average voltages of two adjacent signal lines from among the plurality of signal lines is between the first constant voltage and the second constant voltage, a gap between the two adjacent signal lines is a third gap that is greater than the first gap and smaller than the second gap.

9. The display device of claim 1, further comprising a substrate,
  wherein the substrate comprises a bending area that is bendable or in a bent state, and
  the wiring portion comprises a portion that is disposed in the bending area.

10. The display device of claim 9, further comprising a first conductive layer, a second conductive layer, and a third conductive layer that are on the substrate and located in different layers from each other,
  wherein
  at least one of the plurality of signal lines comprises a first wire in the first conductive layer, a second wire in the second conductive layer, and a third wire in the third conductive layer,
  the first wire is outside the bending area, and
  in a peripheral area of the bending area, the second wire is electrically connected with the first wire through a first contact portion and the third wire is electrically connected with the second wire through a second contact portion.

11. The display device of claim 10, wherein, in a plan view, the third wire overlaps the first contact portion and the second contact portion.

12. The display device of claim 10, wherein, in the bending area, the second wire and the third wire extend in parallel with each other while overlapping each other.

13. A display device comprising:
  a display area comprising a plurality of pixels;
  a peripheral area that is outside the display area and includes a bending area; and
  a wiring portion comprising a first group, a second group, and a third group that are adjacent to each other,
  wherein each of the first group, the second group, and the third group comprises signal lines that include portions passing the bending area,
  the second group is between the first group and the third group,
  the signal lines in the second group are configured to transmit clock signals of which voltage levels are changed with a period that is shorter than 1/10 of one frame,
  the signal lines in the first group are configured to transmit signals of a first polarity during a continuous time of 9/10 of the frame or more, and
  the signal lines in the third group are configured to transmit signals of a second polarity during a continuous time of 9/10 of the frame or more.

14. The display device of claim 13, wherein at least one of the first group and the third group comprises a signal line configured to transmit a signal of which a voltage is changed by the frame.

15. The display device of claim 13, wherein
  when a difference between average voltages of two adjacent signal lines from among the signal lines is a first constant voltage or less, a gap between the two adjacent signal lines is a first gap,
  when the difference between average voltages of the two adjacent signal lines from among the signal lines is greater than a second constant voltage or more, the gap between the two adjacent signal lines is a second gap that is greater than the first gap, and
  when the difference between average voltages of the two adjacent signal lines from among the signal lines is between the first constant voltage and the second constant voltage, the gap between the two adjacent signal lines is a third gap that is greater than the first gap and smaller than the second gap.

16. The display device of claim 13, wherein, in at least one of the first group, the second group, and the third group, the signal lines are arranged in an order of average voltages of signals that are respectively transmitted by the signal lines during one frame.

17. The display device of claim 16, wherein a gap between adjacent signal lines from among the signal lines is dependent on a difference between average voltages of signals transmitted by the adjacent signal lines.

18. The display device of claim 13, wherein at least one of the signal lines comprises wires that are respectively in a first conductive layer, a second conductive layer, and a third conductive layer that are respectively different conductive layers from each other,
the first conductive layer is outside the bending area,
the second conductive layer and the third conductive layer comprise portions that pass the bending area, and
in a peripheral area of the bending area, the second conductive layer is electrically connected with the first conductive layer through a first contact portion, and the third conductive layer is electrically connected with the second conductive layer through a second contact portion.

19. The display device of claim 18, wherein, in a plan view, the third conductive layer overlaps the first contact portion and the second contact portion.

20. A display device comprising:
a display area comprising a plurality of pixels;
a peripheral area that is outside the display area; and
a wiring portion that is in the peripheral area,
wherein the wiring portion comprises a gate low voltage wire, a first frame signal wire, a common voltage wire, a plurality of clock signal lines, a second frame signal wire, and a gate high voltage wire, which are sequentially arranged.

21. The display device of claim 20, further comprising an initialization voltage wire that is between the common voltage wire and the plurality of clock signal lines.

22. The display device of claim 21, further comprising a test circuit voltage wire that is between the second frame signal wire and the gate high voltage wire.

23. A display device comprising:
a display panel comprising:
a display area comprising a plurality of pixels;
a peripheral area that is outside the display area, and comprising a bending area; and
a wiring portion comprising a first group, a second group, and a third group that are adjacent to each other,
wherein:
each of the first group, the second group, and the third group comprises signal lines that include portions passing the bending area;
the first group is closest to an edge of the display panel from among the first group, the second group, and the third group;
the third group is farthest from the edge of the display panel from among the first group, the second group, and the third group;
the second group is between the first group and the third group;
a first signal line from among the signal lines of the first group is configured to transmit a first signal;
a second signal line from among the signal lines of the second group is configured to transmit a second signal;
a third signal line from among the signal lines of the third group is configured to transmit a third signal;
an average voltage of the second signal during one frame is greater than an average voltage of the first signal during the one frame; and
an average voltage of the third signal during the one frame is greater than the average voltage of the second signal during the one frame.

24. The display device of claim 23, wherein:
a polarity of the first signal is maintained during a continuous time of $9/10$ of the frame or more,
a polarity of the third signal is maintained during a continuous time of $9/10$ of the frame or more, and
a voltage level of the second signal is changed with a period that is shorter than $1/10$ of one frame.

25. The display device of claim 23, wherein at least one of the first group and the third group comprises a signal line configured to transmit a signal of which a voltage is changed by the frame.

* * * * *